United States Patent [19]

Dias et al.

[11] Patent Number: 5,010,552
[45] Date of Patent: Apr. 23, 1991

[54] DEVICE AND METHOD FOR THE GENERATION OF TEST VECTORS AND TESTING METHOD FOR INTEGRATED CIRCUITS

[75] Inventors: Bernard Dias; Arnaud du Chene, both of Paris, France

[73] Assignee: Thomson-CSF, Paris, France

[21] Appl. No.: 107,502

[22] Filed: Oct. 8, 1987

[30] Foreign Application Priority Data

Oct. 10, 1986 [FR] France ................... 86 14148

[51] Int. Cl.$^5$ ............... G01R 31/28; G06F 11/22
[52] U.S. Cl. ................................................ 371/27
[58] Field of Search .................. 371/16, 21, 20, 25, 371/27, 21.1, 21.2, 16.1; 324/73 R, 73 AT, 73 PC, 73.1

[56] References Cited

U.S. PATENT DOCUMENTS

| | | | |
|---|---|---|---|
| 3,576,541 | 4/1971 | Kwan et al. | 371/25 |
| 3,832,535 | 8/1974 | De Vito | 324/73 AT |
| 3,961,250 | 6/1976 | Snethen | 371/25 |
| 4,225,957 | 9/1980 | Doty, Jr. et al. | 371/25 |
| 4,493,045 | 1/1985 | Hughes, Jr. | 371/27 |
| 4,503,538 | 3/1985 | Fritz | 371/21 |
| 4,517,672 | 5/1985 | Pfleiderer et al. | 371/27 |
| 4,622,647 | 11/1986 | Sagnard et al. | 371/27 |
| 4,625,311 | 11/1986 | Fitzpatrick et al. | 371/21 |
| 4,672,610 | 6/1987 | Salick | 371/27 |
| 4,692,920 | 9/1987 | Tannhaeuser et al. | 371/27 |
| 4,719,599 | 1/1988 | Natsui et al. | 371/21 |

FOREIGN PATENT DOCUMENTS

| | | | |
|---|---|---|---|
| 1512238 | 2/1967 | France . | |
| 60-42665 | 3/1985 | Japan | 371/27 |
| 62-43577 | 2/1987 | Japan | 371/20 |

OTHER PUBLICATIONS

"9-V Algorithm for Test Pattern Generation of Combinational Digital Circuits" by Cha et al., IEEE Trans. on Computers, vol. C-27, 03/1978, pp. 193-200.
"Design for Testability for Complete Test Coverage" by Motohara et al., D&T Translation, 11/1984, pp. 25-32.
IEEE Design & Test of Computers, vol. 2, #5, Oct. 1985, pp. 54-60, IEEE, New York, U.S.-S. Funatsu et al. "An Automatic Test-Generation System for Large Digital Circuits".
IEEE Intercon Conference Record, Apr. 8-10, 1975, pp. 1-9, New York, U.S., S. S. Yau et al; "A Survey of Fault Diagnosis of Digital Circuits".
IEEE Transactions on Computers, vol. C-28, No. 11, Nov. 1979, pp. 845-853, IEEE, New York, U.S.-J. E. Smith, Detection of Faults in Programmable Logic Arrays.
IEEE Transactions on Computers, vol. C-31, #2, Feb. 1982, pp. 129-139, IEEE, New York, U.S.-Y. M. El--Ziq et al,-Fault Diagnosis of MOS Combinational Networks.
Ninth International Symposium on Fault-Tolerant Computing, Madison, Wisc., Jun. 1979, pp. 227-234, IEEE, New York, U.S., Agarwal-Multiple Fault Detection in Programmable Logic Arrays.

*Primary Examiner*—Geoffrey S. Evans
*Attorney, Agent, or Firm*—Roland Plottel

[57] ABSTRACT

A device and a method are used to test integrated circuits, especially P.L.A.s. The possible faults of a circuit to be tested are determined including logic faults caused by the physical structure and relative position of the circuit elements in the integrated logic circuit. On the basis of the faults, a set of test vectors is determined, each fault modifying at least one of the test vectors applied to the circuit to be tested. It is possible to use test vectors which are modified by the greatest number of possible faults. By determining the test vectors on the basis of the faults which are to be detected, the tests can use a small number of vectors while, at the same time, there is certainty that it will be possible to detect all the faults in a given circuit. Advantageously, a hierarchically-organized set of cells is determined with certain cells consisting of small cells. The method and device can be used to test P.L.A.s by using a small number of test vectors, and are applicable to testing integrated circuits and P.L.A.s.

7 Claims, 19 Drawing Sheets

FIG_1
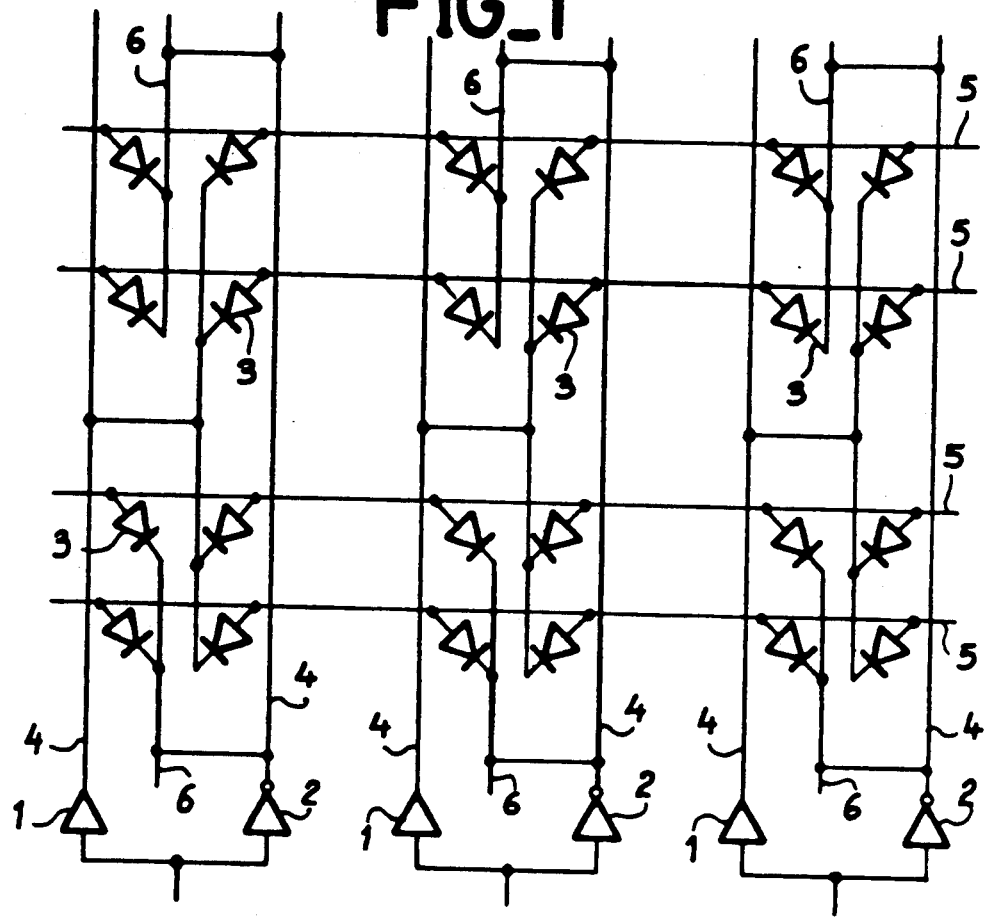
FIG_2
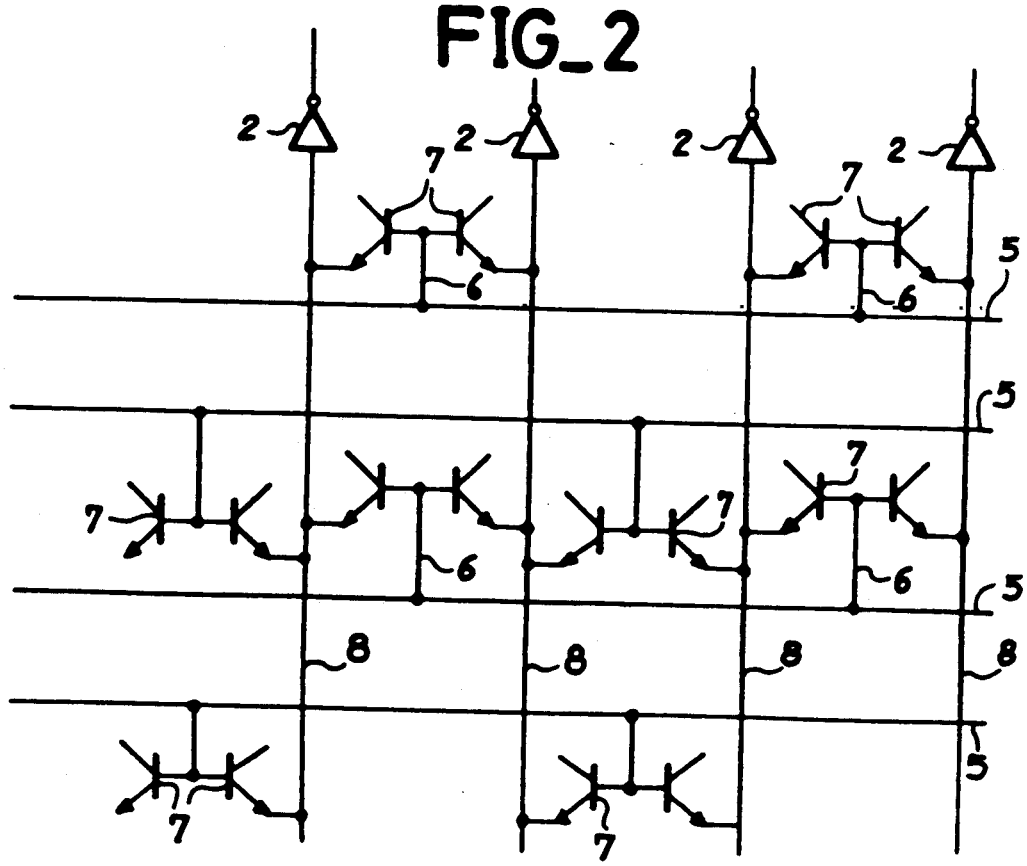

FIG_3
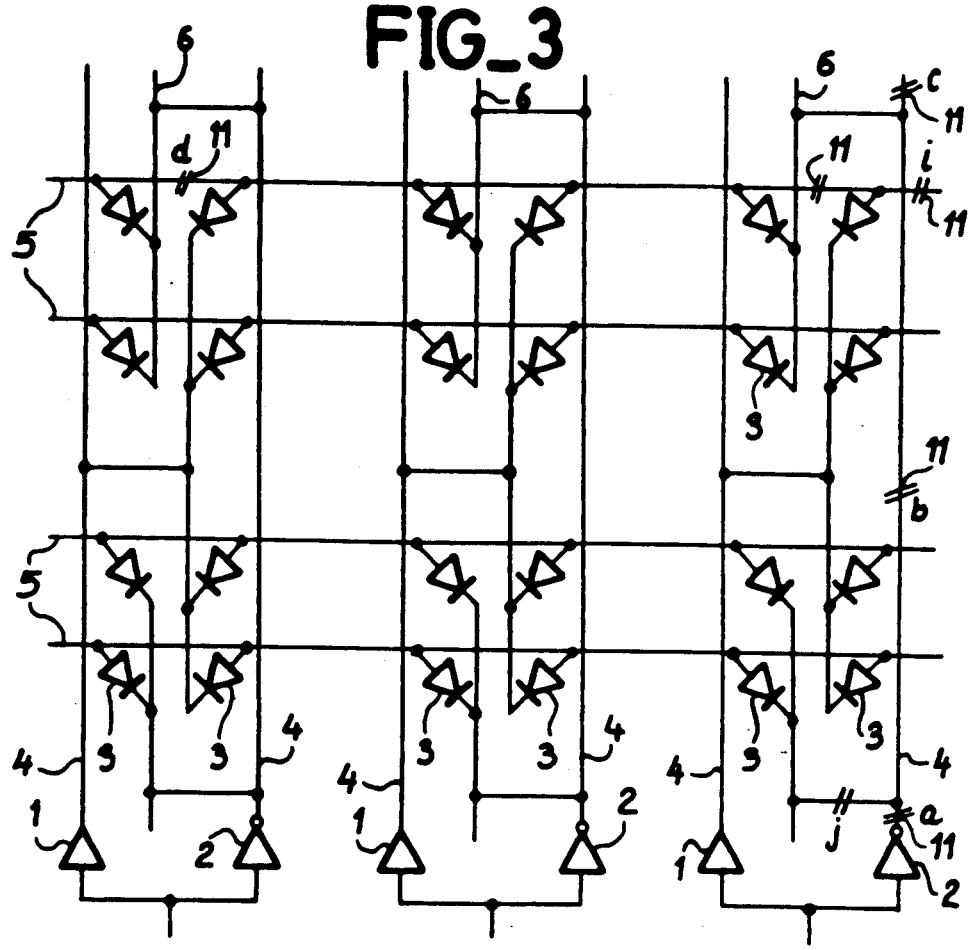
FIG_4
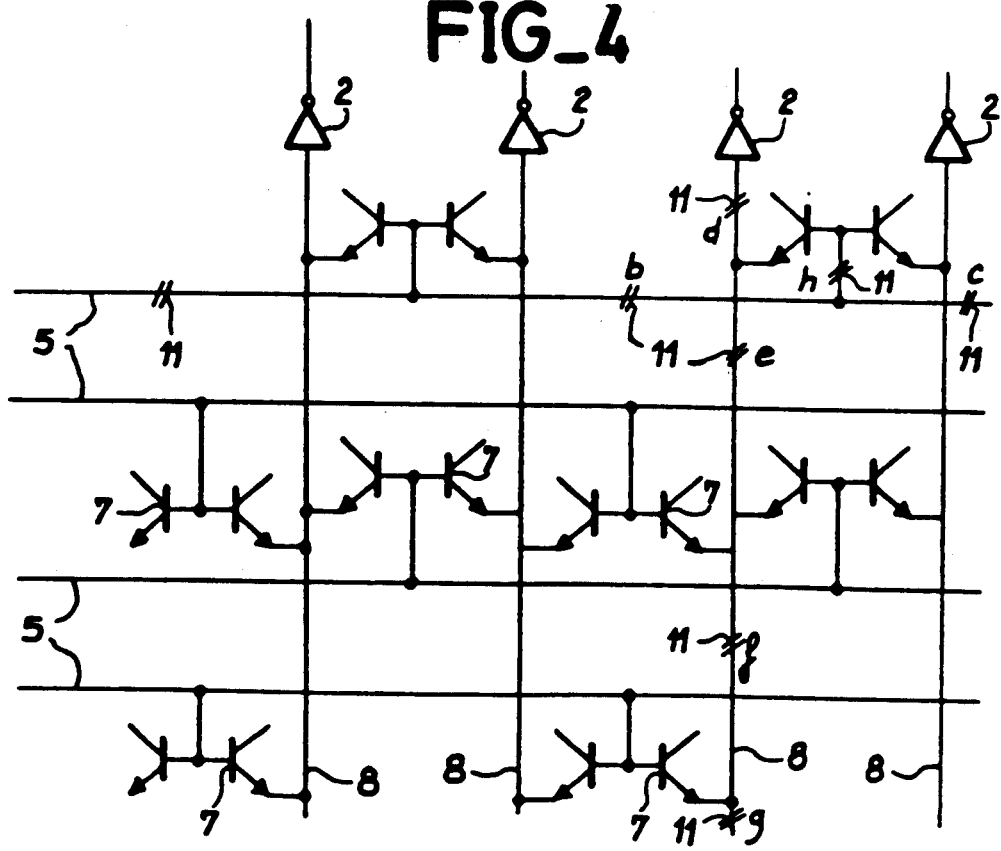

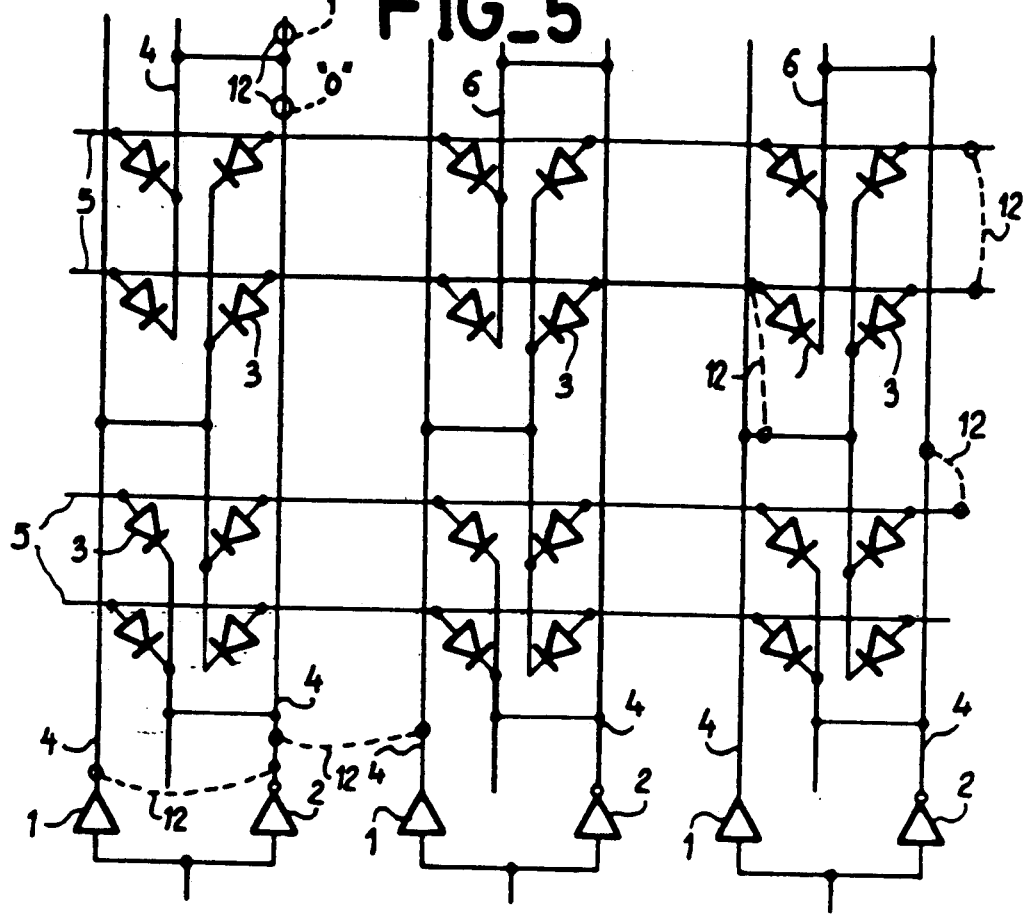
FIG_5
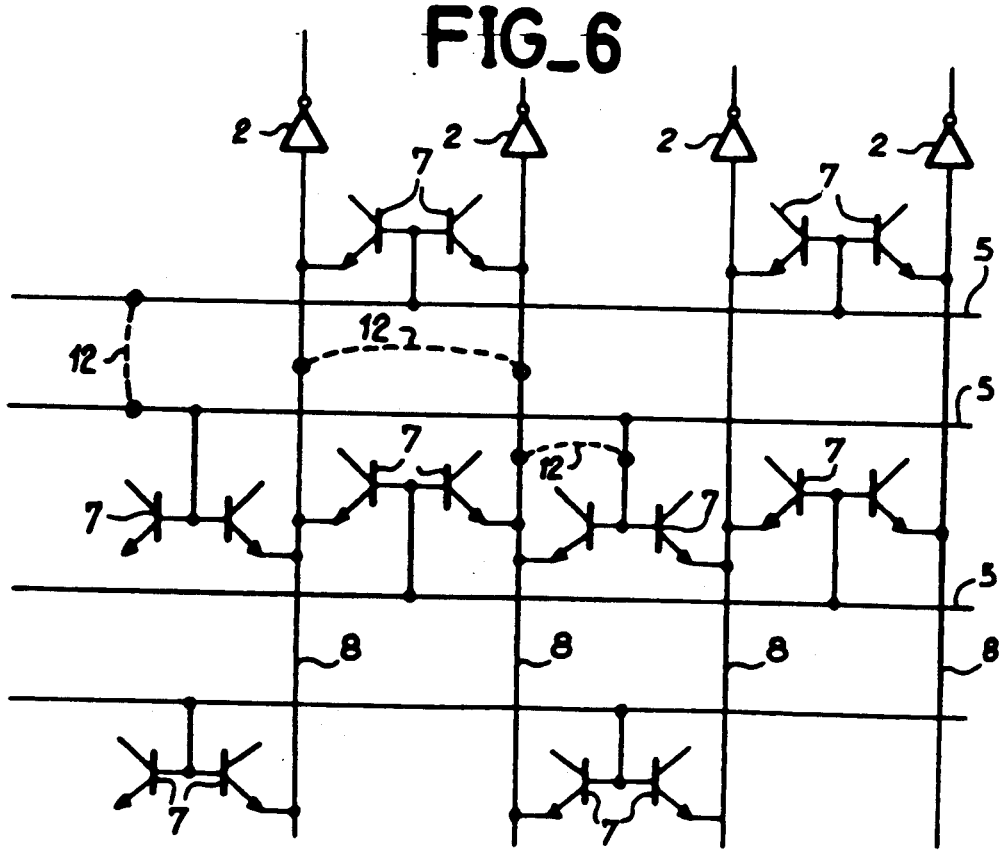
FIG_6

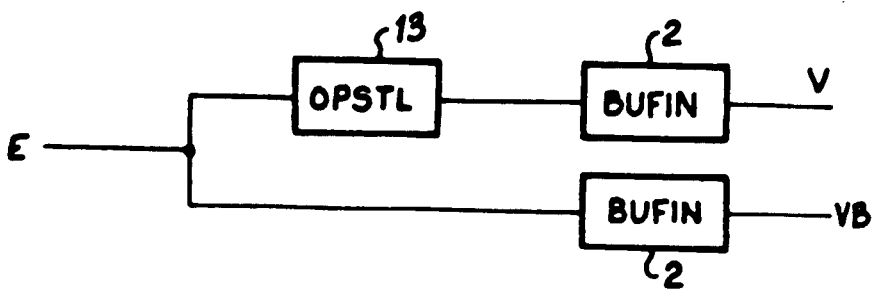
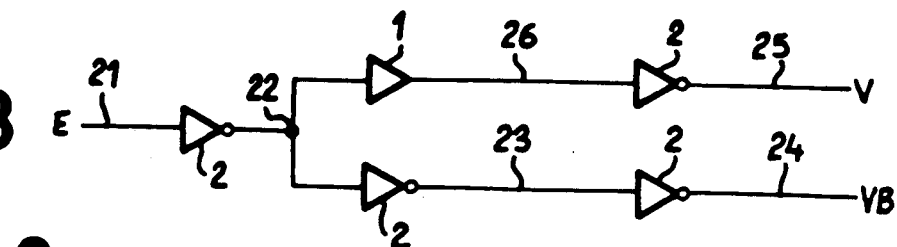
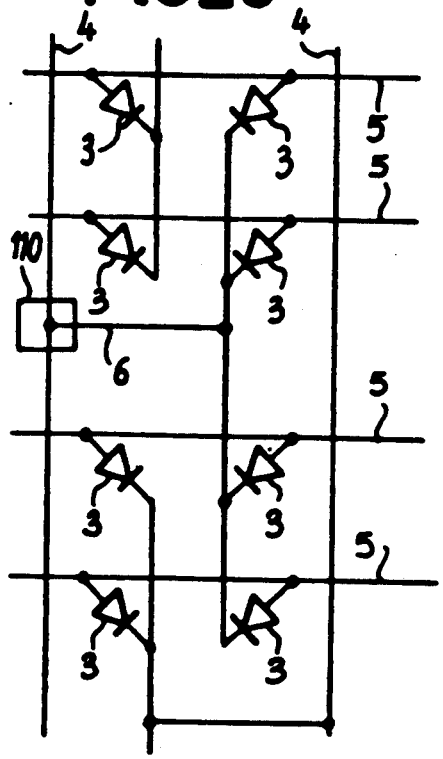
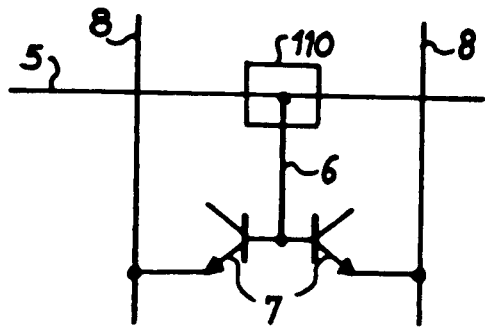
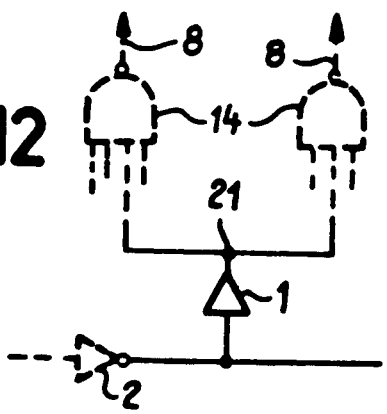
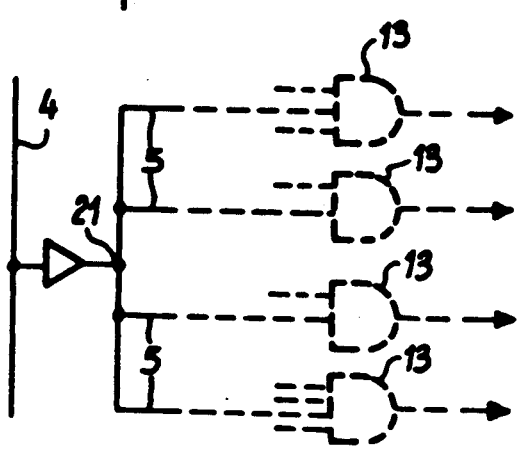

FIG_13
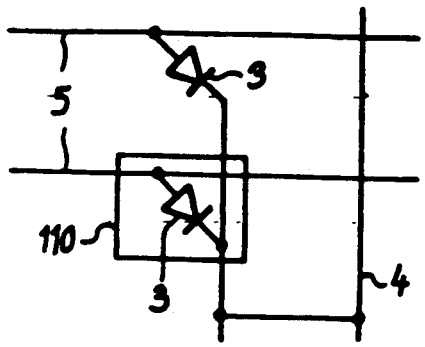
FIG_14
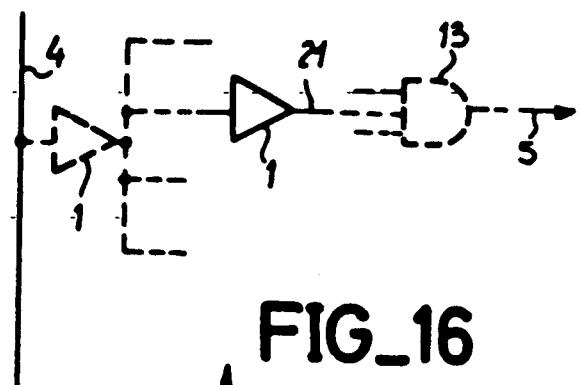
FIG_15
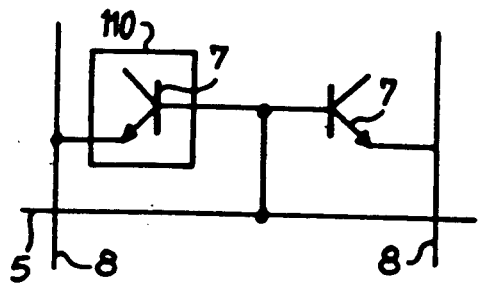
FIG_16
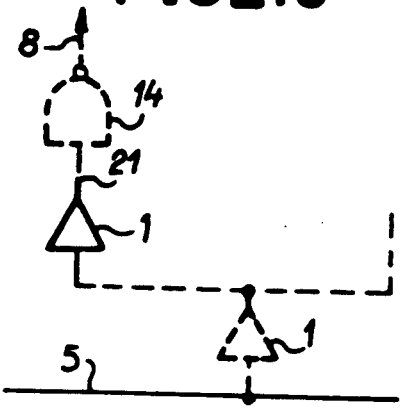
FIG_17
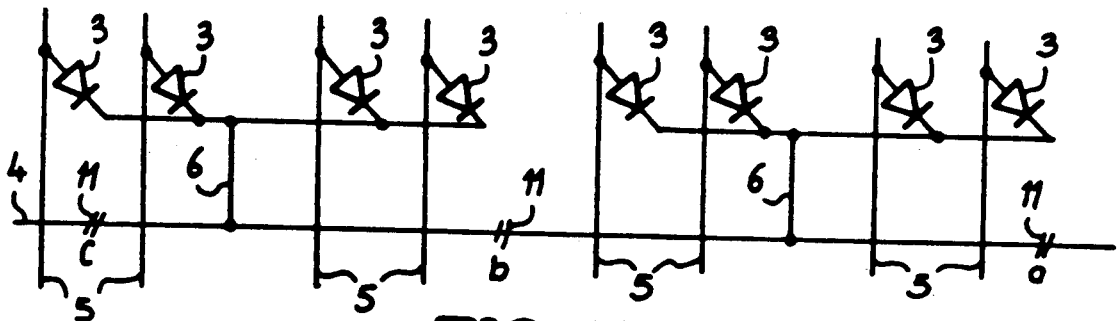
FIG_18
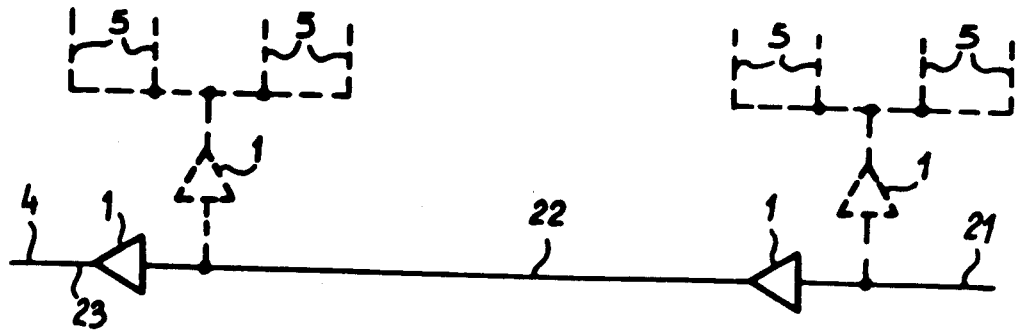

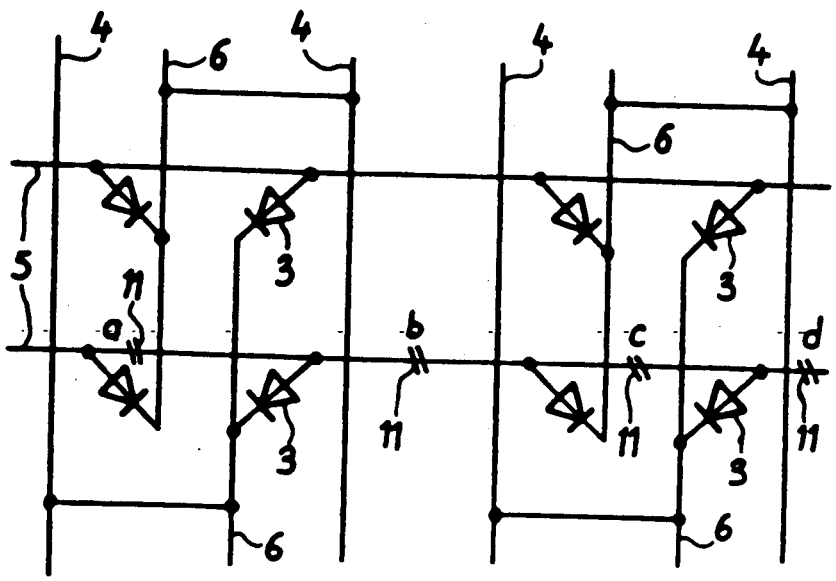
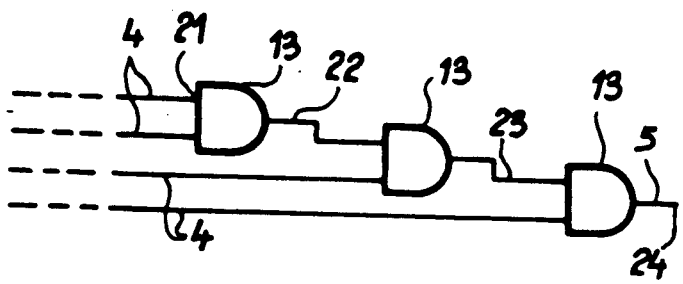
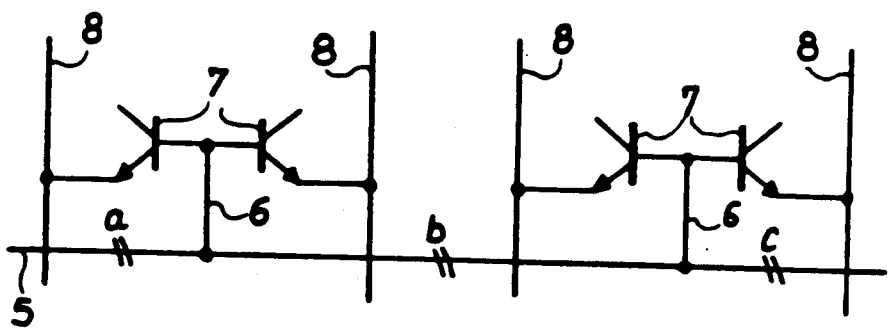
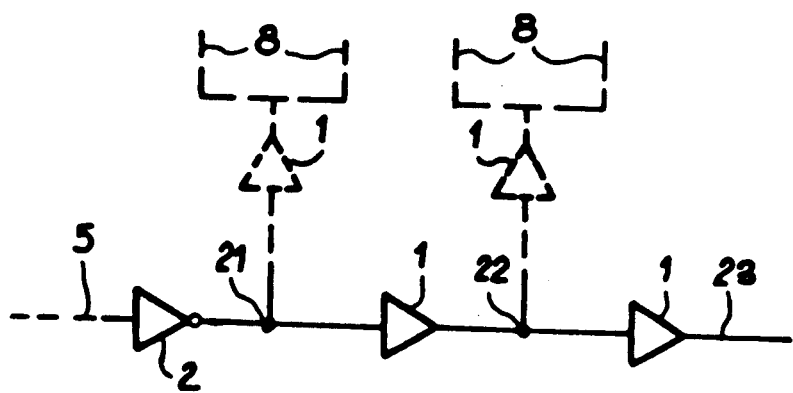

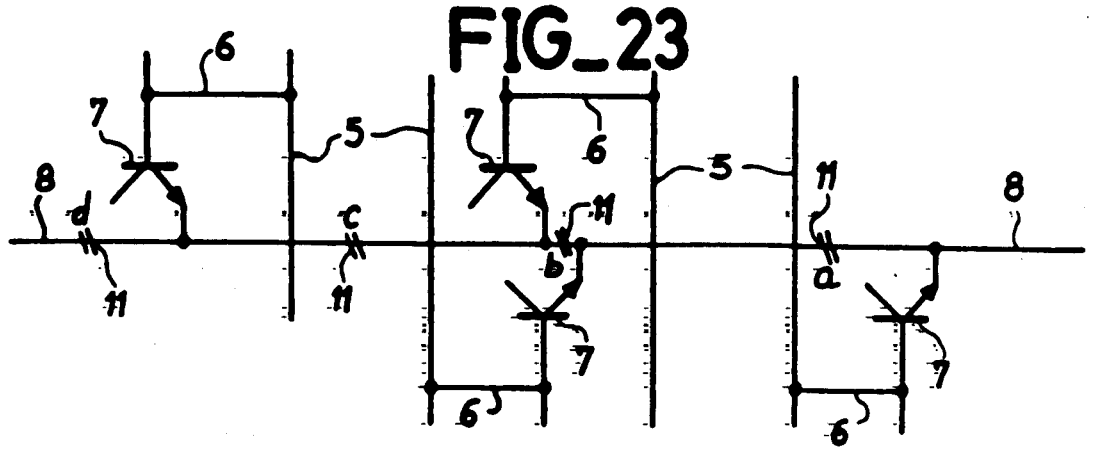
FIG_23
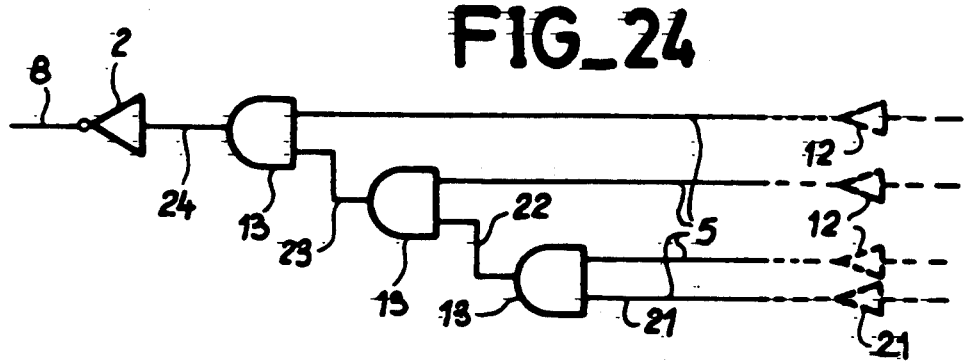
FIG_24
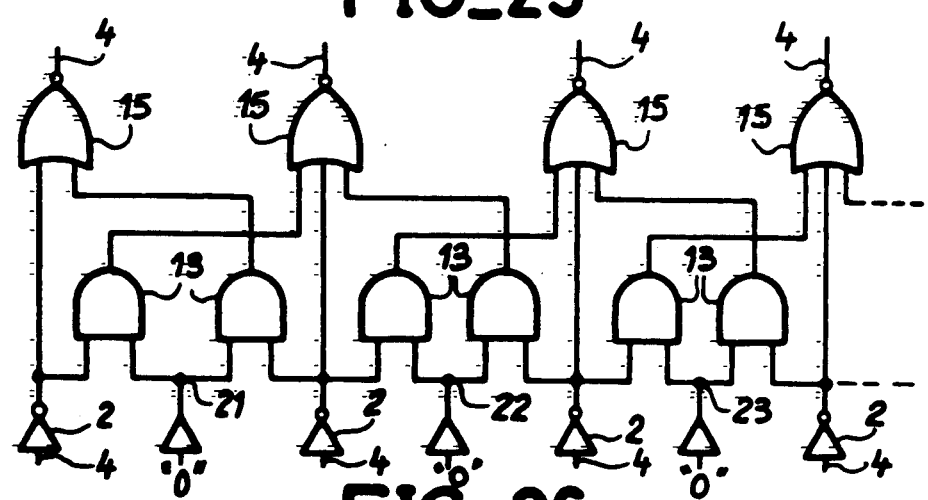
FIG_25
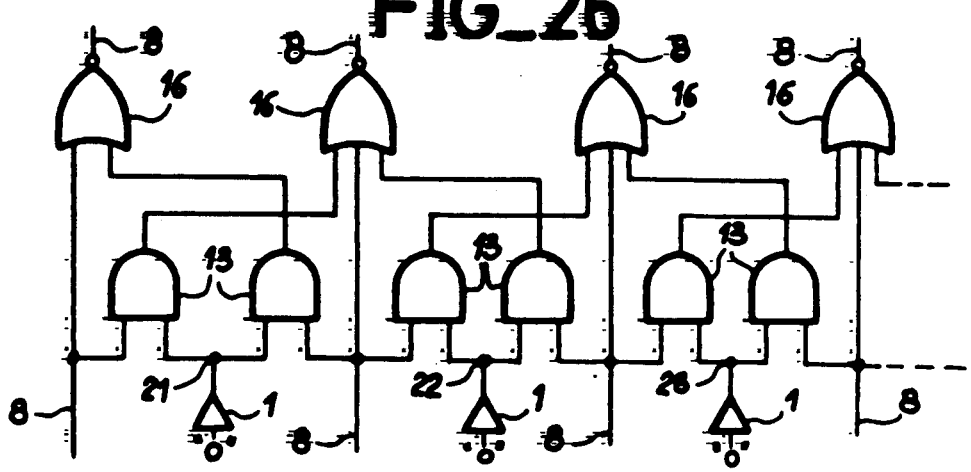
FIG_26

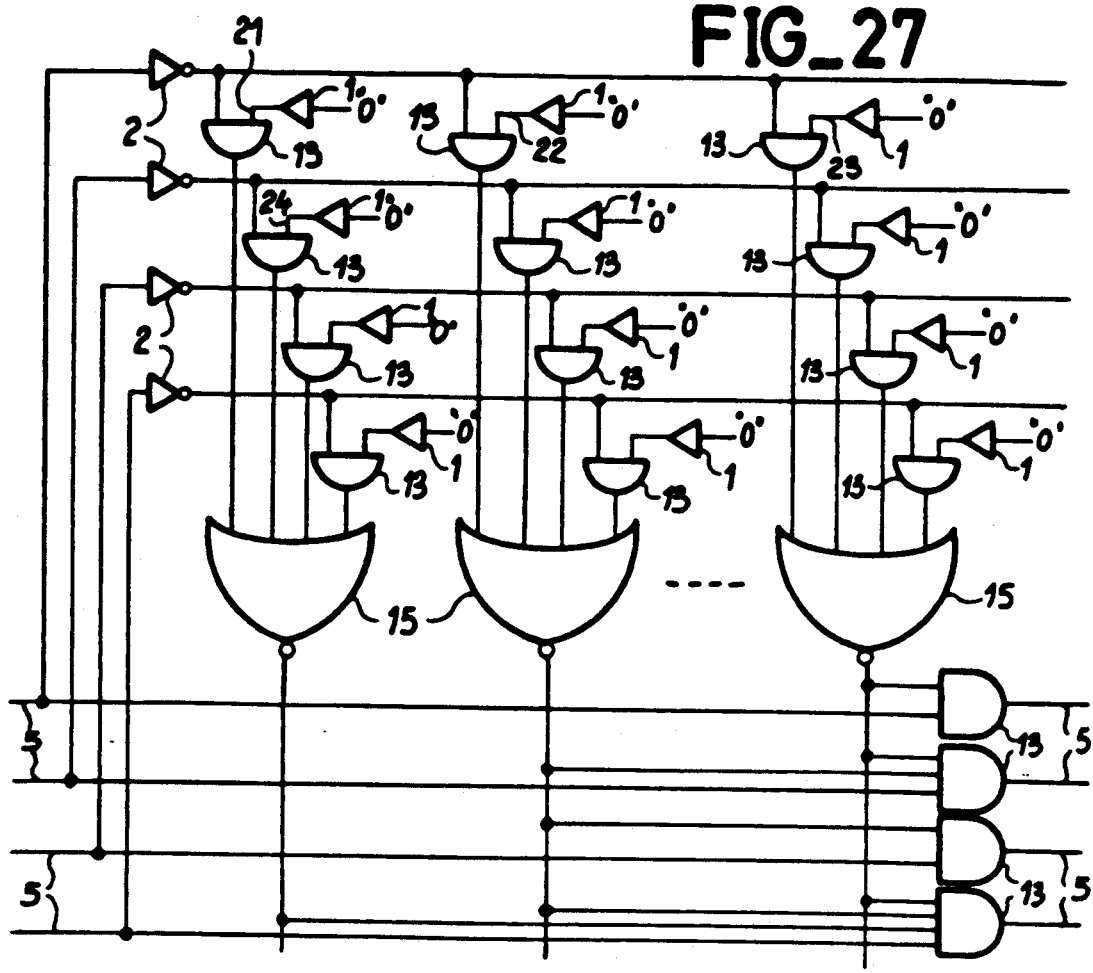
FIG_27
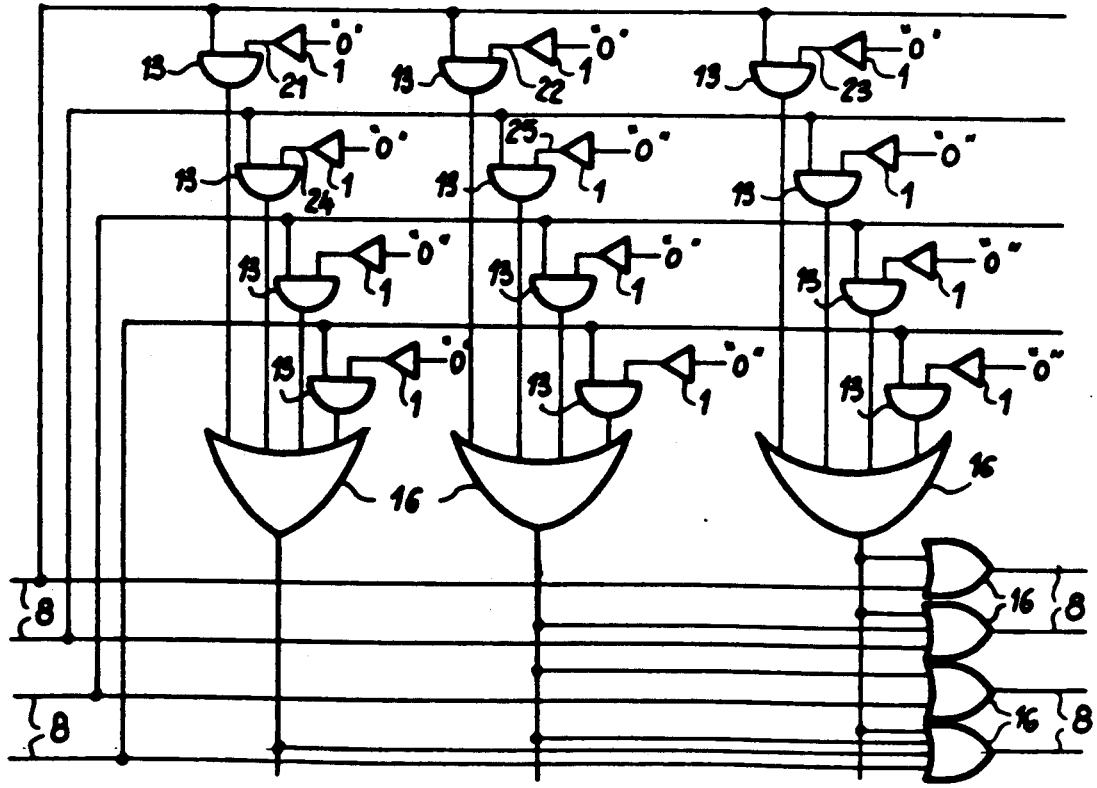
FIG_28

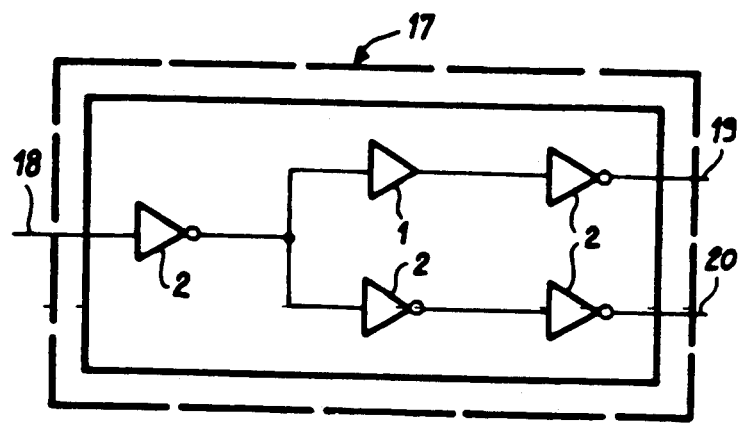
FIG_29
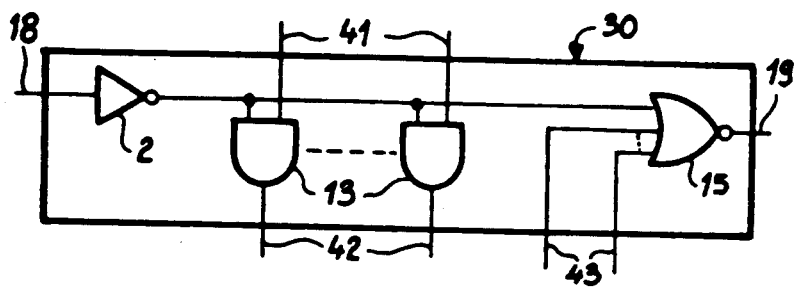
FIG_30
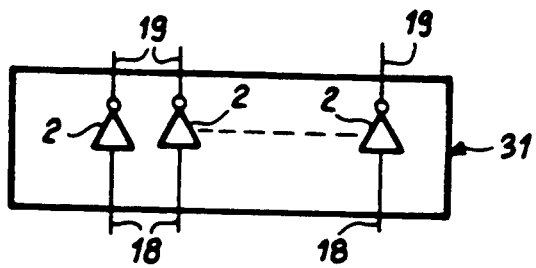
FIG_31
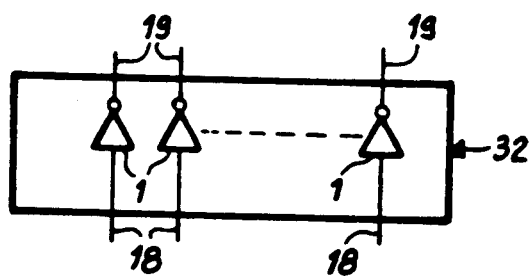
FIG_32
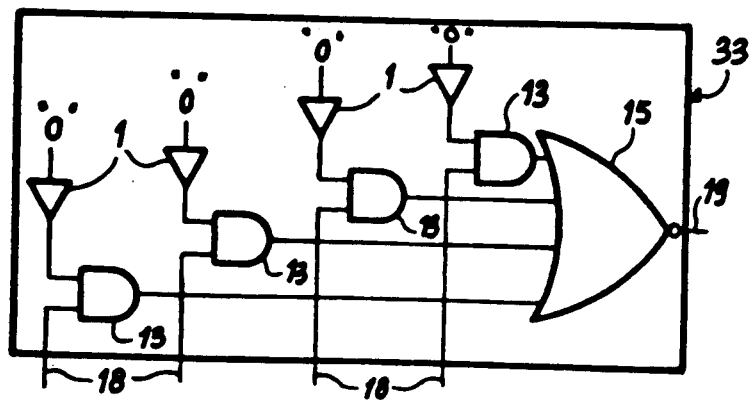
FIG_33

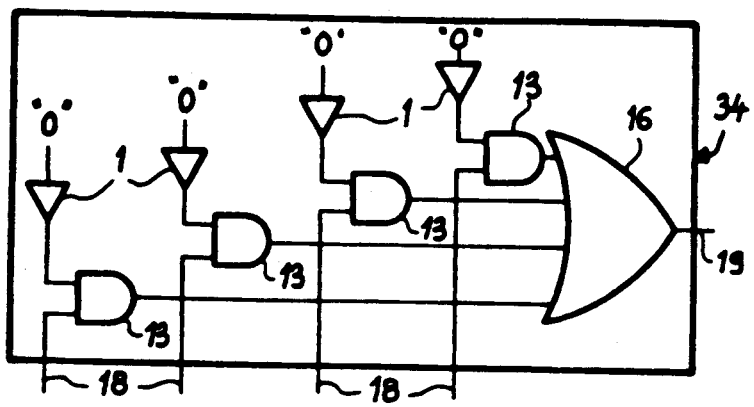
FIG_34
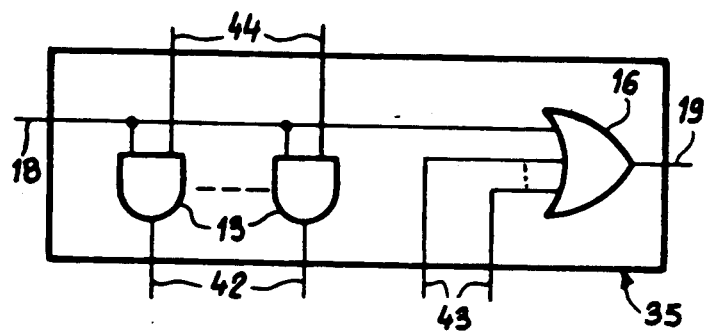
FIG_35
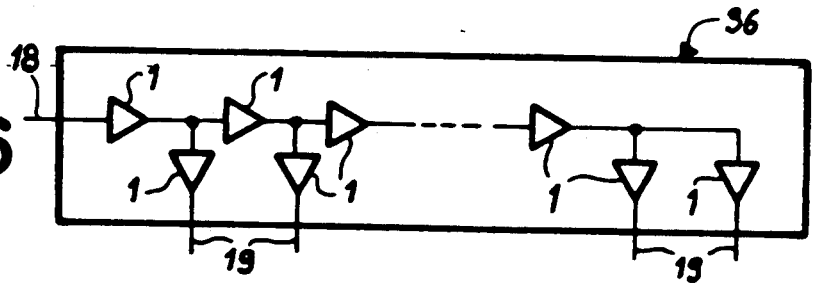
FIG_36
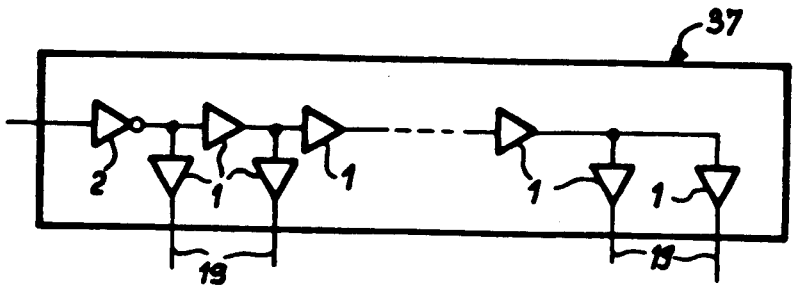
FIG_37

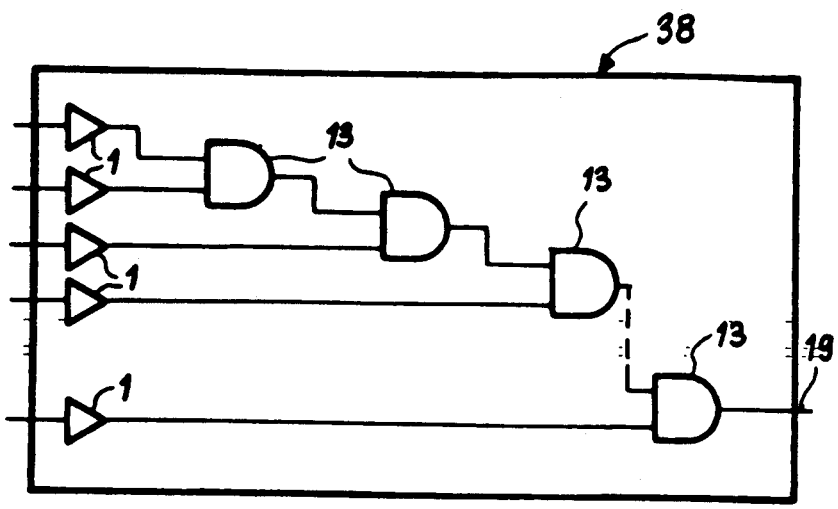
FIG_38
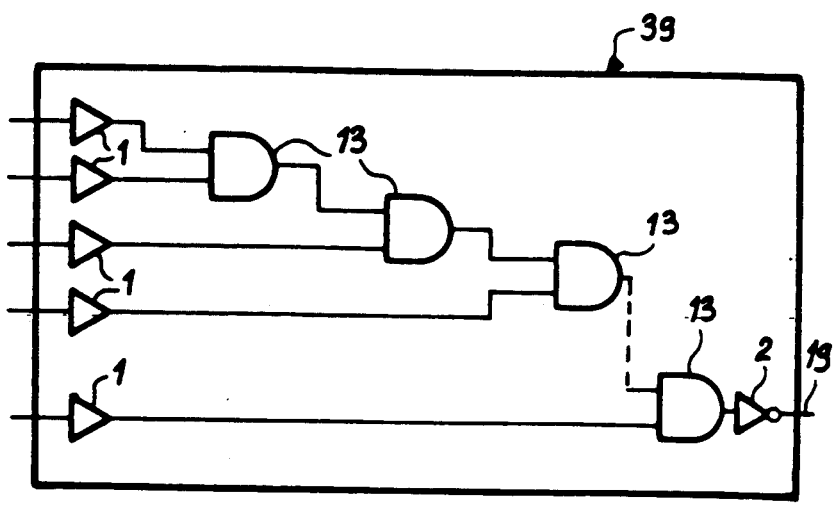
FIG_39
FIG_40
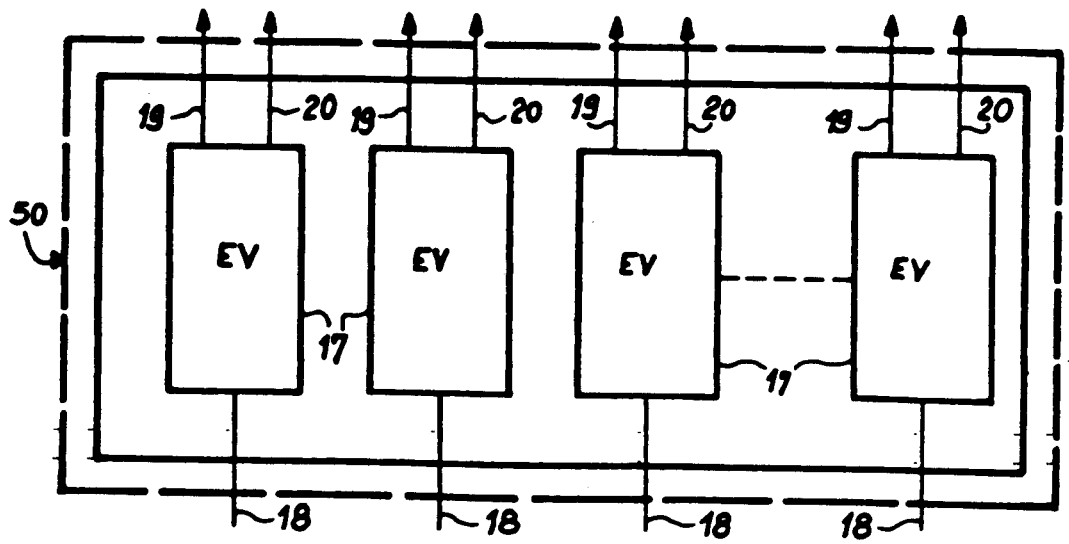

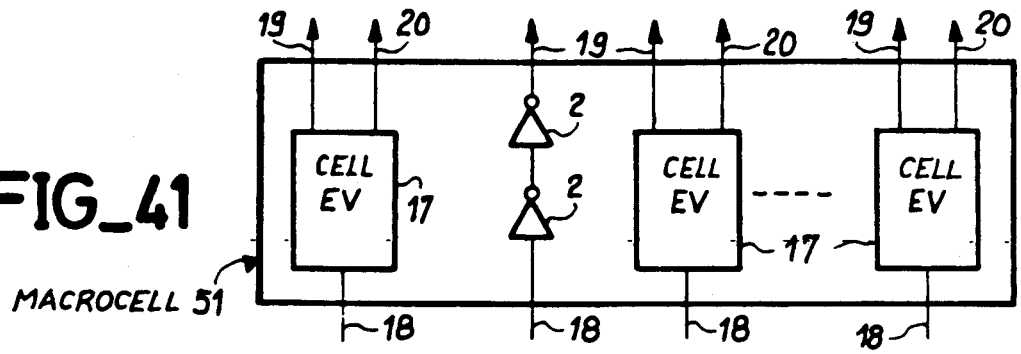
FIG_41
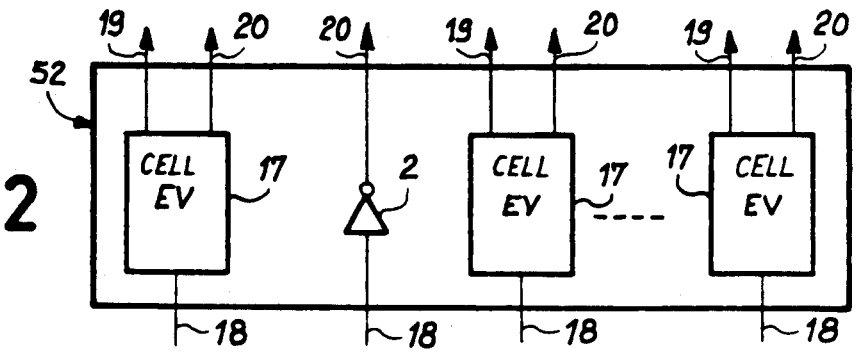
FIG_42
FIG_43
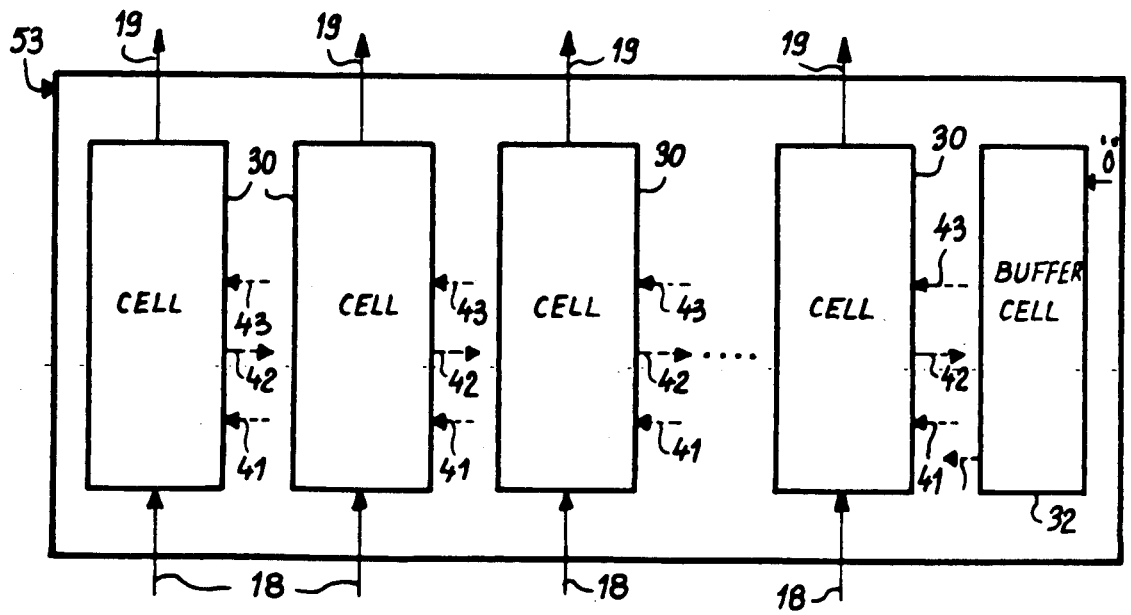

FIG_44
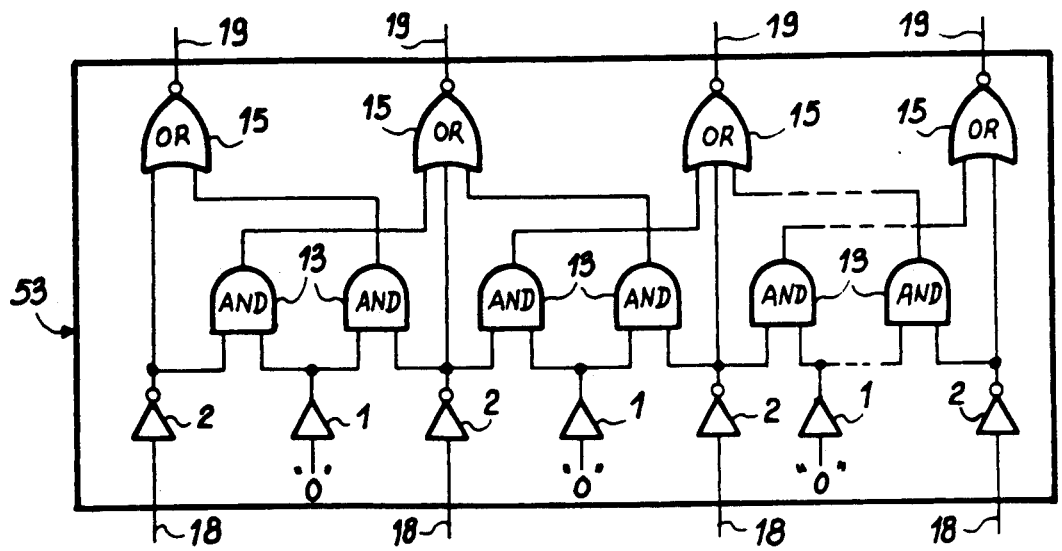
FIG_45
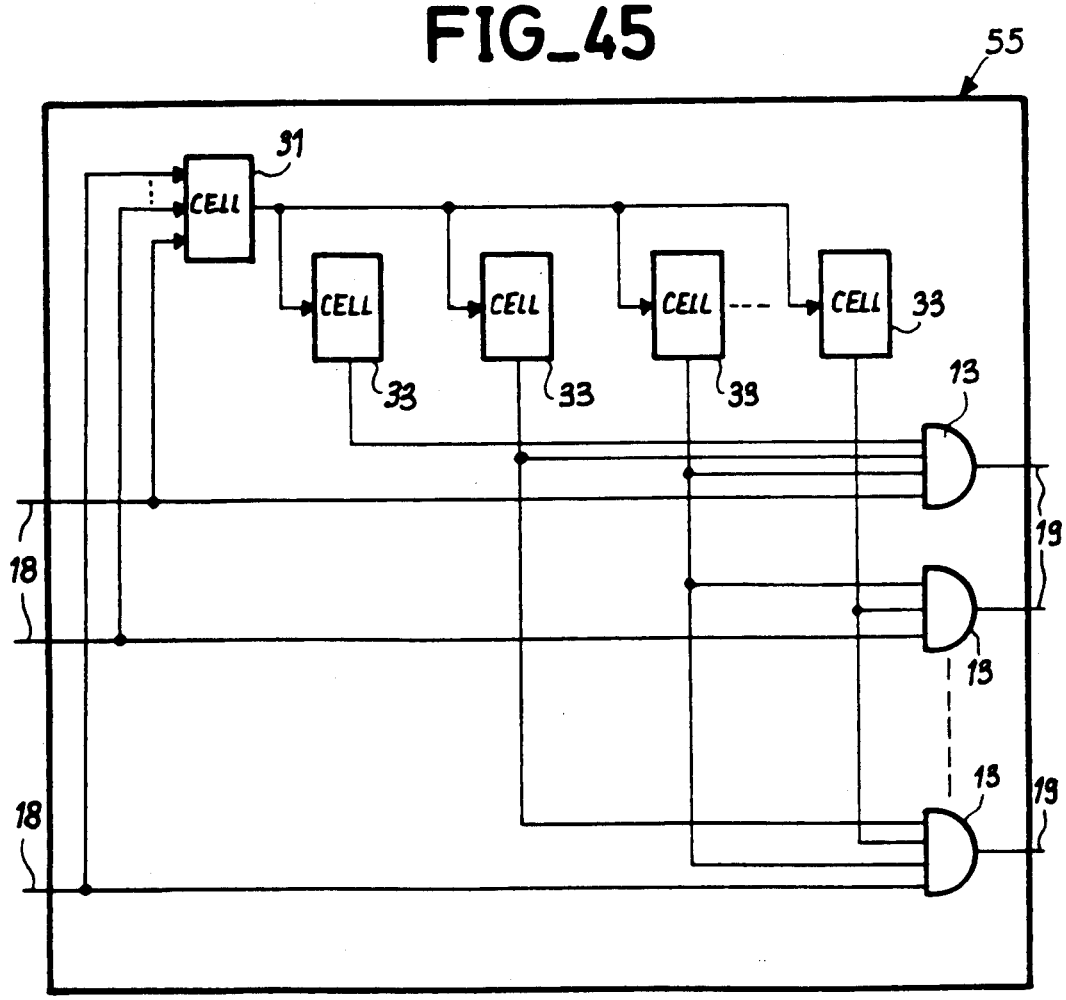

FIG_46
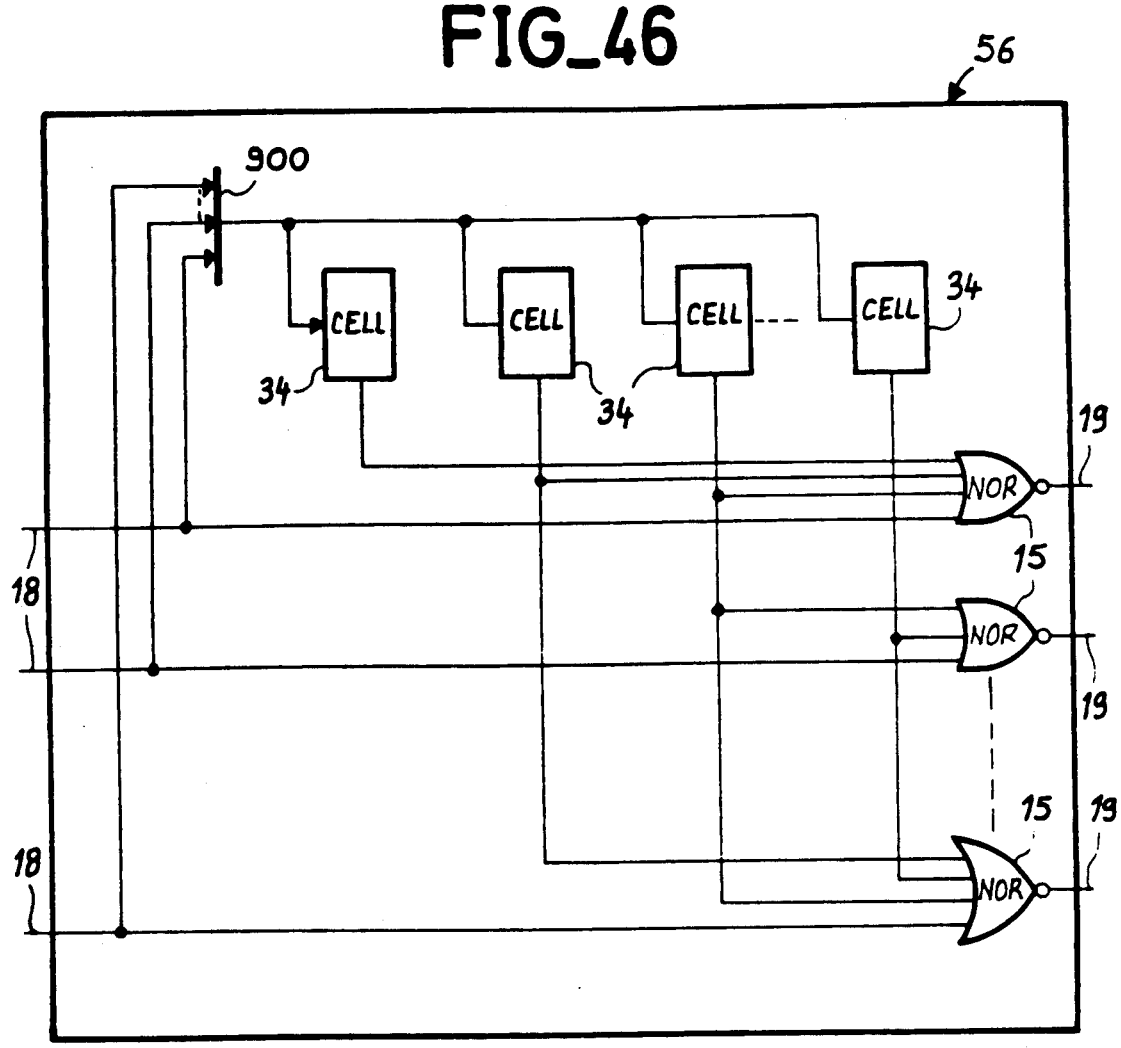
FIG_47
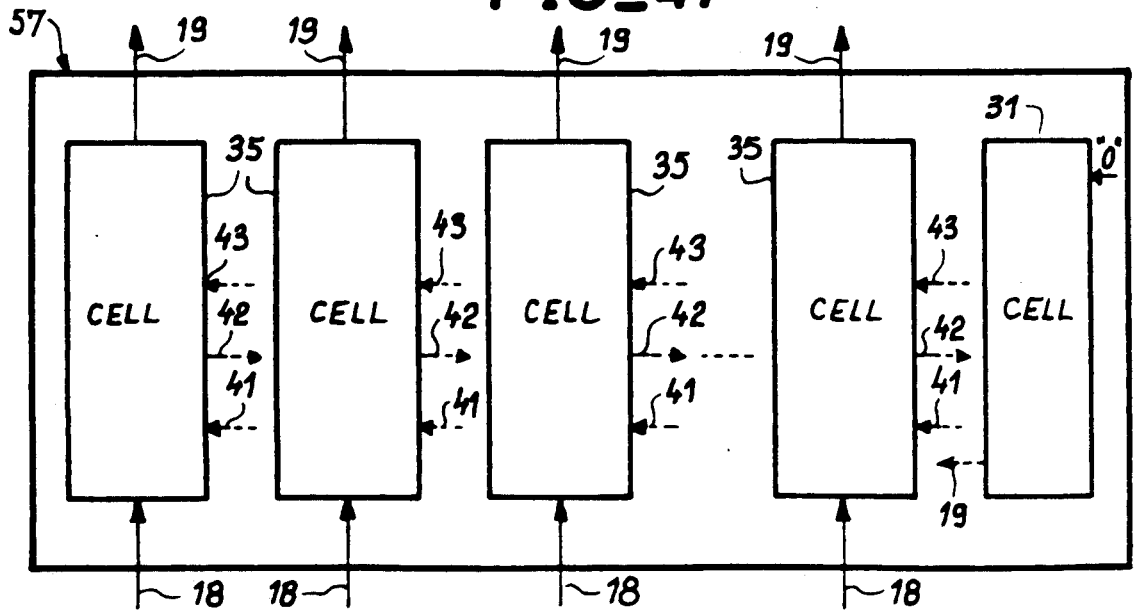

FIG_48
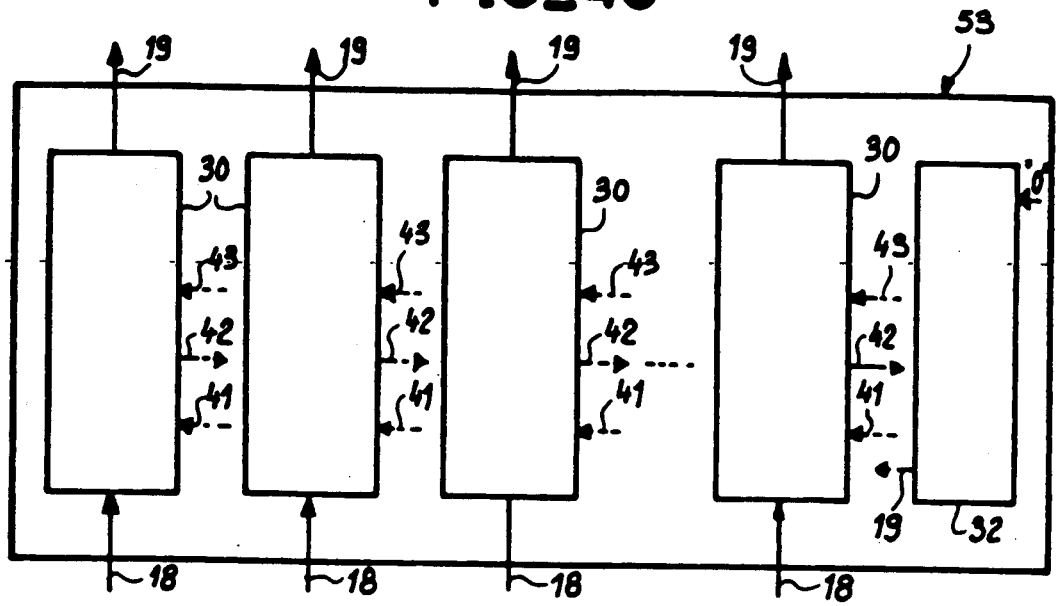
FIG_50
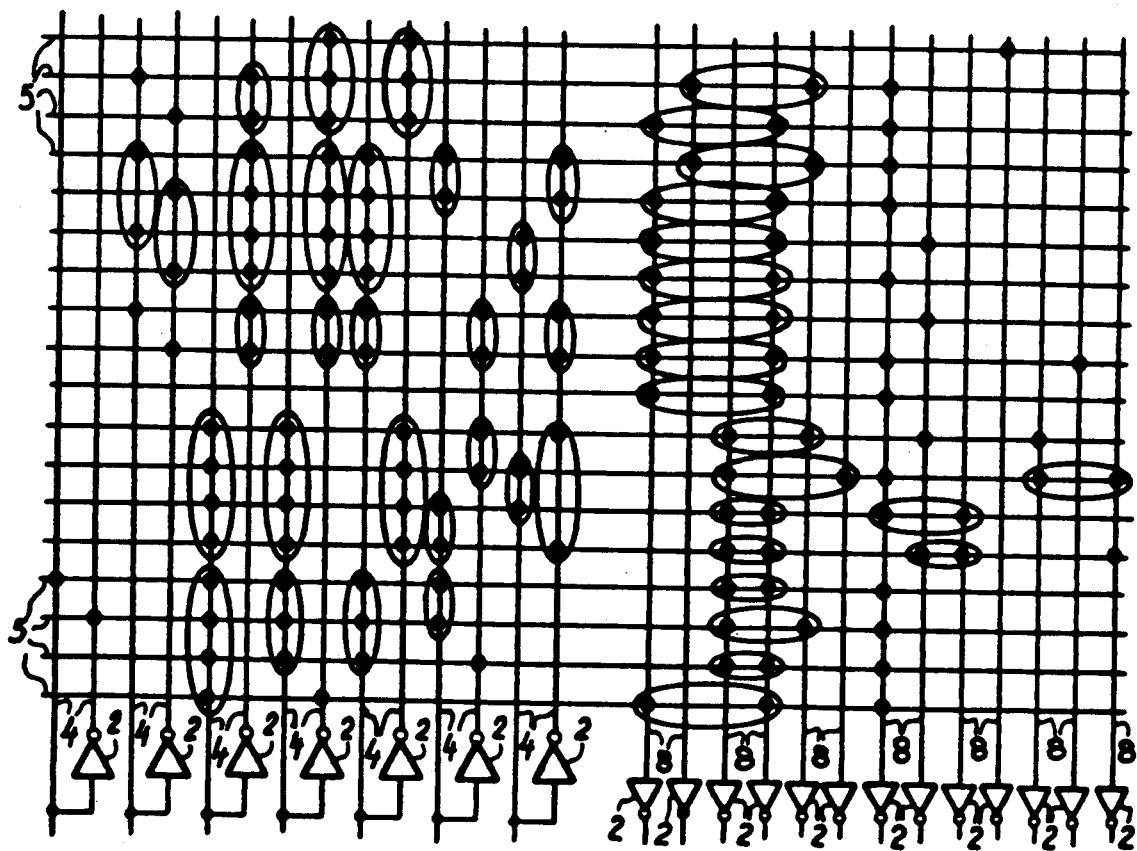

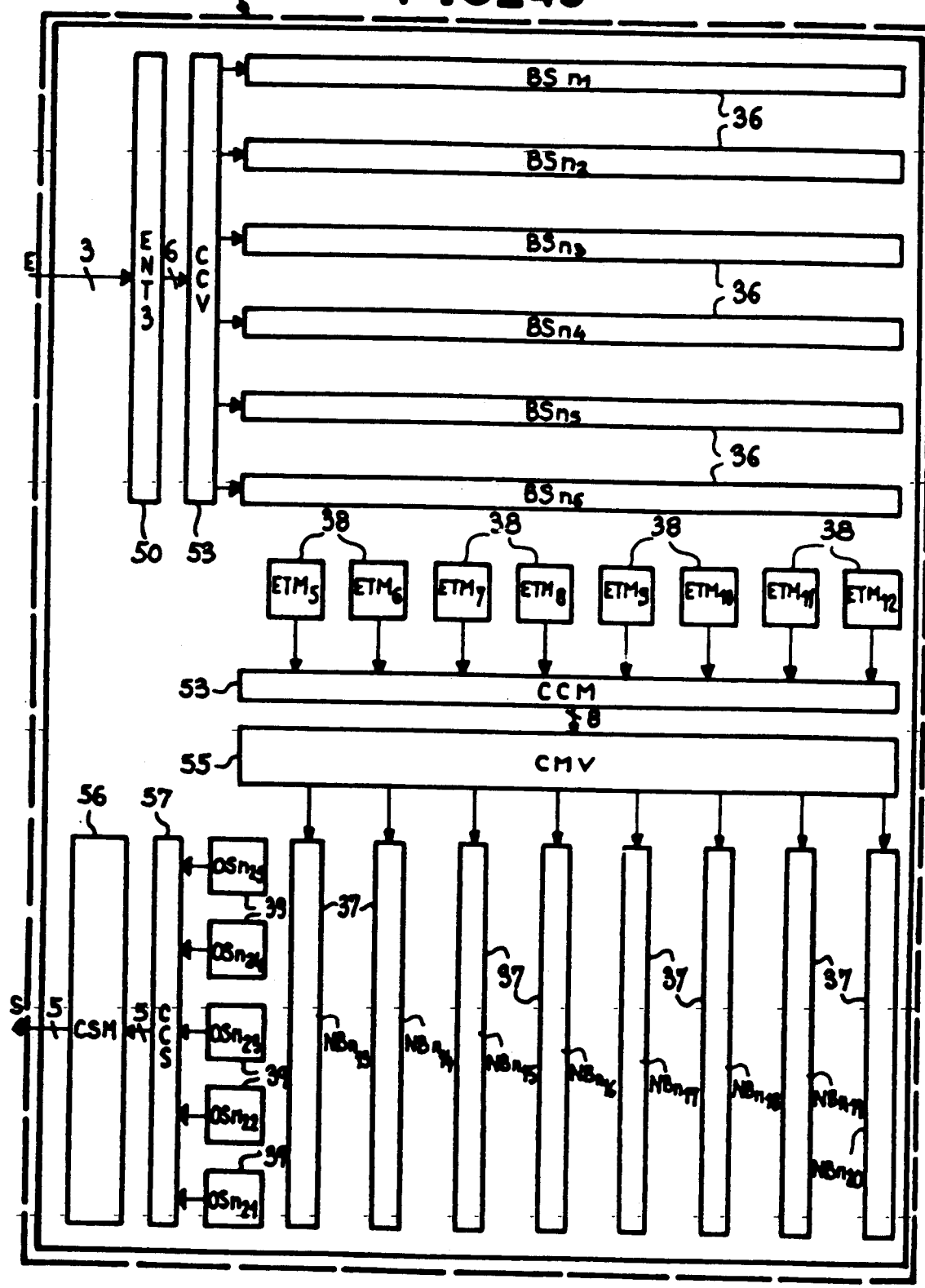

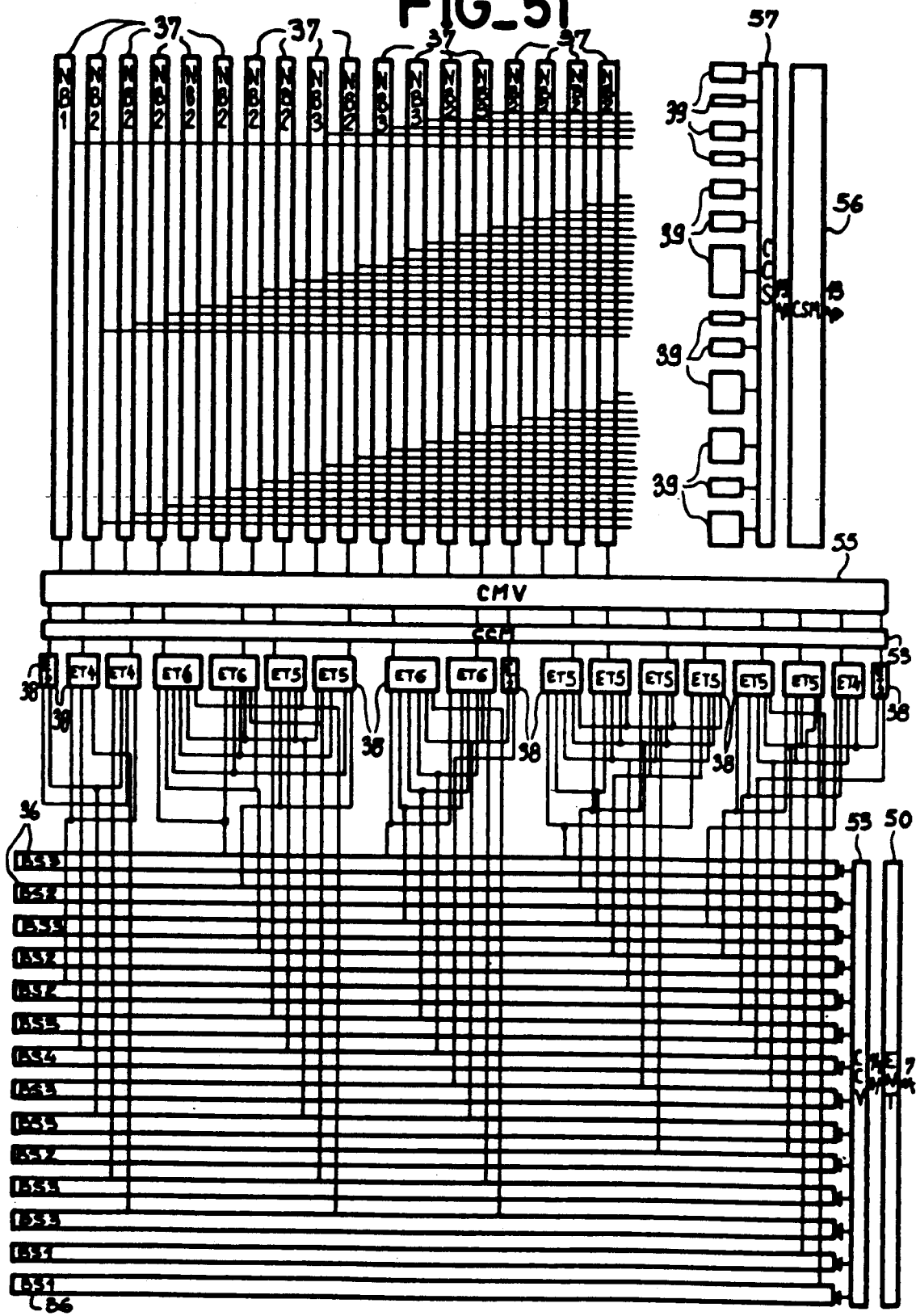
FIG_51

```
CCT PLA13X7(CXM1[0:2],CXM2[0:2],CXE2[0:1],CXE1[0:2],ACX,EXTS,F,SSE,OPAL[0:4])

EMT     EMTo1(A[1],A[3],A[5],A[7],A[9],A[11],A[13],A[2],A[4],A[6],A[8],
              A[10],A[12],A[14],F,SSE,OPAL[0:4]));
    CCV     CCVo1(B[1:14],A[1:14]);
    BS1     BS1o1(C[2],B[1])              BS1o2(C[3],B[2]);
    BS2     BS2o1(C[1],C[14],B[5])        BS2o2(C[12],C[31],B[10])
            BS2o3(C[9],C[24],B[13]),
    BS3     BS3o1(C[15],C[29],C[35],B[3]) BS3o2(C[16],C[28],C[34],B[4])
            BS3o3(C[17],C[27],C[33],B[6]) BS3o4(C[4],C[13],C[18],B[7])
            BS3o5(C[5],C[20],C[25],B[9])  BS3o6(C[6],C[11],C[30],B[11])
            BS3o7(C[7],C[10],C[21],B[12]) BS3o8(C[8],C[22],C[23],B[14]),
    BS4     BS4o1(C[36],C[19],C[26],C[32],B[8]);
    ET2     ET2o1(D[1],C[33],C[32])       ET2o2(D[10],C[17],C[18])
            ET2o3(D[16],C[1],C[36]);
    ET4     ET4o1(D[2],C[35],C[33],C[32],C[31])
            ET4o2(D[3],C[34],C[33],C[32],C[31])
            ET4o3(D[17],C[1],C[4],C[5],C[7]);
    ET5     ET5o1(D[6],C[29],C[27],C[26],C[25],C[24])
            ET5o2(D[7],C[28],C[27],C[26],C[25],C[24])
            ET5o3(D[11],C[14],C[13],C[12],C[10],C[8])
            ET5o4(D[12],C[14],C[13],C[12],C[10],C[9])
            ET5o5(D[13],C[14],C[13],C[12],C[11],C[9])
            ET5o6(D[14],C[14],C[13],C[12],C[11],C[8])
            ET5o7(D[15],C[2],C[1],C[4],C[5],C[6])
            ET5o8(D[16],C[3],C[1],C[4],C[5],C[6]);
    ET6     ET6o1(D[4],C[29],C[27],C[26],C[25],C[30],C[23])
            ET6o2(D[5],C[28],C[27],C[26],C[25],C[30],C[23])
            ET6o3(D[8],C[15],C[17],C[19],C[20],C[21],C[22])
            ET6o4(D[9],C[16],C[17],C[19],C[20],C[21],C[22]);
    CCM     CCMo1(E[1:18],D[1:18]);
    CMV     CMVo1(G[1:18],E[1:18]);
    MB1     MB1o1(H[1],G[1]);
    MB2     MB2o1(H[6],H[23],G[2))        MB2o12(H[24],H[7],G[3])
            MB2o11(H[25],H[8],G[4])       MB2o2(H[26],H[9],G[5])
            MB2o3(H[27],H[10],G[6])       MB2o4(H[28],H[11],G[7])
            MB2o5(H[31],H[14],G[10))      MB2o6(H[34],H[17],G[13])
            MB2o7(H[36],H[19],G[15))      MB2o8(H[37],H[20],G[16])
            MB2o9(H[38],H[21],G[17))      MB2o10(H[39],H[22],G[18])
            MB2o13(H[29],H[12],G[8]);
    MB3     MB3o1(H[30],H[13],H[2],G[9])  MB3o2(H[32],H[15],H[3],G[11])
            MB3o3(H[33],H[16],H[4],G[12]) MB3o4(H[35],H[18],H[5],G[14]),
    OS8     OS8o1(I[1],H[24],H[26],H[27],H[28],H[29],H[30],H[31],H[39]);
    OS2     OS2o1(I[2],H[23],H[25])       OS2o2(III,H[3],H[4])
            OS2o3(IIII,H[4],H[5])         OS2o4(II[9],H[17],H[18]);
    OS7     OS7o1(I[3],H[32],H[33],H[34],H[35],H[36],H[37],H[38]);
    OS12    OS12o1(I[4],H[24],H[26],H[27],H[28],H[29],H[30],H[31],H[34],H[35],
                   H[36],H[38],H[39]);
    OS4     OS4o1(I[5],H[23],H[25],H[32],H[37])
            OS4o2(II[8],H[10],H[12],H[15],H[18]);
    OS13    OS13o1(II[7],H[6],H[7],H[8],H[9],H[11],H[13],H[14],H[16],H[17],
                   H[19],H[20],H[21],H[22]);
    CCS     CCSo1(J[1:13],I[1:5],H[33],II[7:9],H[1],III,H[2],IIII);
    CSM     CSMo1(CXM1[0:2],CXM2[0:2],CXE2[0:1],CXE1[0:2],ACX,EXTS,J[1:13]);
    WIRE    A[1:14] B[1:14] C[1:36] D[1:18] E[1:18] G[1:18] H[1:39]
            I[1:5] II[7:9] III IIII J[1:13] CXM1[0:2] CXM2[0:2]
            CXE2[0:1] CXE1[0:2] ACX EXTS F SSE OPAL[0:4].
```

FIG_52

FIG_53
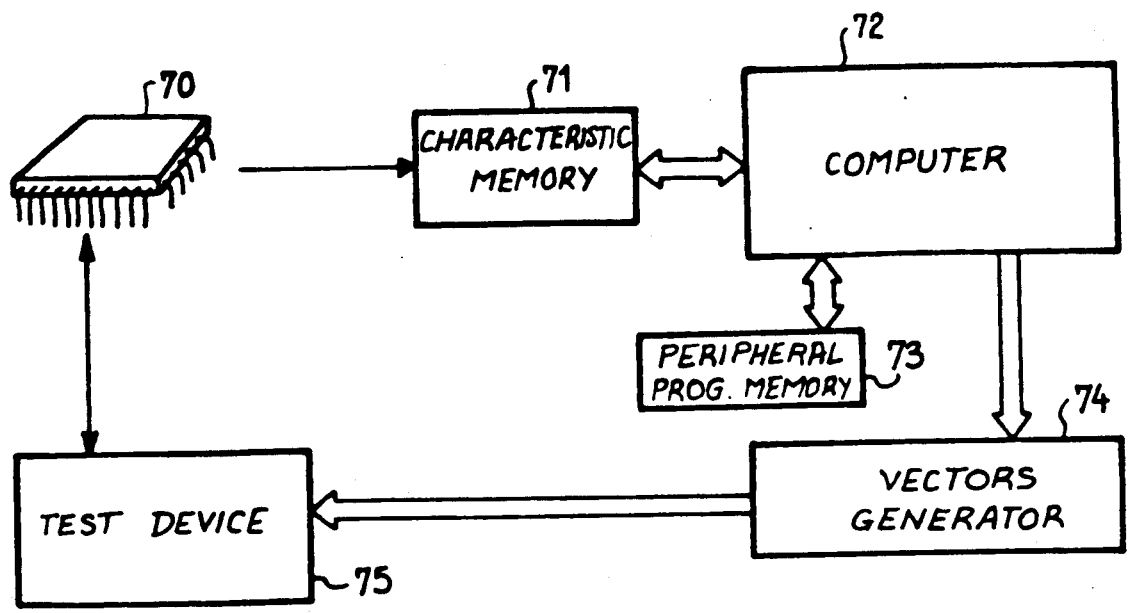
FIG_54
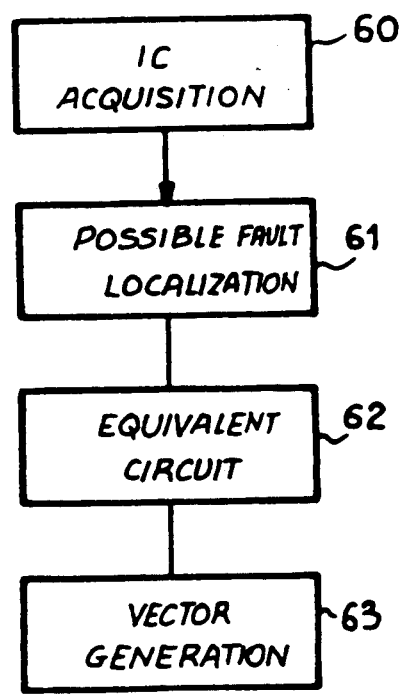

DEVICE AND METHOD FOR THE GENERATION OF TEST VECTORS AND TESTING METHOD FOR INTEGRATED CIRCUITS

BACKGROUND OF THE INVENTION

1. Field of the Invention

The present invention pertains to a device and method for the generation of test vectors and to a testing method for integrated circuits.

The use of present-day manufacturing technologies to increase the number of integrated circuits manufactured and, thus, to reduce their cost entails a trend towards reducing their size, often to the limits of what is technologically possible. In the manufacturing process, integrated circuits that work perfectly, as well as faulty ones, are made, and the integrated circuits that work perfectly must imperatively be separated from the faulty ones. Furthermore, it is desirable to test the circuits as early as possible. This is the case, for example, with wafers which have many circuits. Thus, the manufacturing process is pursued only for integrated circuits that have successfully undergone testing.

2. Brief Description of the Prior Art

One prior art method entails the testing of integrated circuits by applying all the possible combinations of signals to them and ascertaining that the responses given by the integrated circuits comply with the expected results. For combinational circuits, the test is then said to be complete, inasmuch as there is no memory effect internal to the circuit which would make the said circuit sequential. The length of an exhaustive test sequence increases exponentially with the number of bits of test vectors to be applied to the circuit. With modern circuits, which comprise a large number of inputs and, therefore, require long test sequences, it is generally impossible or extremely expensive to conduct an exhaustive test on an integrated circuit.

Such a test would last very long and would require an excessively large memory for the testing device.

It is also possible, in prior art methods, to reduce the number of test vectors applied to an integrated circuit. Either the testing is restricted to test vectors which can detect a limited number of faults considered to be possible, or a sequence of pseudo-random vectors is sent with a high possibility of detecting any fault in the circuit.

The flaw in methods of the exhaustive type is that they use a large number of vectors. Furthermore, prior art methods are completely inapplicable to programmable logic arrays or circuits (hereinafter called P.L.A.).

Whereas, in combinational circuits with basic logic operators, it was possible to define a few classes of faults, both simple and general enough to offer the possibility of making models of failures (jamming at 0 or at 1 etc.) in various technologies, this is not possible for P.L.A.s.

The "jamming" of an integrated circuit equipotential element is a fault in which the value "0" is associated with this equipotential element independently of the signal present at the said equipotential element.

The jamming of an integrated circuit equipotentional connection at 1 is a fault of the said circuit in which the value "1" is associated with an equipotential element of the said integrated circuit independently of the value of the signal present.

A break is an interruption in an electrical conductor.

A short-circuit is the accidental connection of two equipotential elements of an electrical circuit.

The creation of an additional operator is the creation of an unwanted transistor or diode which was not planned when designing the integrated circuit.

This case is considered to be impossible in technologies using Schottky transistors (S.T.L.) as also in most bipolar type technologies.

In these technologies, testing a set of logic operators amounts to testing the proper functioning of each operator and each connection. However, a test of this type would not detect every possible fault in P.L.A. type circuits.

The problem of testing P.L.A.s therefore stems from the fact that it is impossible to establish general models of failures in these circuits.

The device and method according to the present invention enables the logic faults of an integrated circuit to be tested efficiently while, at the same time, it diminishes the number of test vectors needed.

In a first stage, all possible faults to be detected are determined. In a second stage, a testing sequence to detect these faults is generated; this is a test sequence which causes a sequence of false circuit responses whenever any of the faults is present.

This method is general enough for testing all logic circuits, including P.L.A.s.

Advantageously, an equivalent diagram of the circuit to be tested is made. The said equivalent diagram can be processed by a generator of test vectors of a known type. The equivalent diagram is constructed such that each possible failure of the circuit is represented, in the equivalent circuit, by one of the connections being jammed at "1". It is obvious that the equivalent diagram of the circuit to be tested, for example that of the P.L.A., performs the same logic function as the circuit replaced for the test.

The idea of the equivalent circuit diagram can be applied to any technology. However the structure of this diagram depends on the production faults envisaged. For certain faults, the physical structure of the circuit must be taken into account. This is the case, for example, with short circuits between adjacent tracks.

In one alternative embodiment of the invention, the equivalent circuit diagram has sets of hierarchically-organized cells. The basic cells of the equivalent circuit diagram use, for example, HILO simulator primitives: for example, NOT, BUF, AND, NAND, OR, NOR. An equivalent circuit diagram has the following characteristics:

It performs the same logic function as the circuit or P.L.A. to be tested;

Each failure is represented by one of the wires being jammed at 1; the number of unnecessary jammings at 1 (i.e. those that represent no failure) is reduced to the minimum.

There is a general standard structure by which the diagram can be easily adapted to any special circuit.

The use of a structure with hierarchically-organized cells, for example a structure using macrocells and basic cells, gives a regular structure of the equivalent circuit diagram. It is therefore possible to acquire it graphically or to describe the circuits directly in HILO language. The equivalent circuit diagram consists, therefore, in an assembly of cells common to all the circuits which are described once and for all. Solely the assembly of various cells depends on the particular circuit.

The determination of possible faults, through which an equivalent circuit diagram can be obtained, requires a knowledge of the physical organization of the P.L.A. and especially:

The contiguity of the tracks;

The relative position of the vertical connections, called VIAs, on the tracks of variables;

The relative position of the diodes on the tracks of monomials;

The relative position of the VIAs on the tracks of monomials;

The relative position of the transistor emitters on the output tracks;

The grouping of diodes in one and the same pattern;

The grouping of transistors in one and the same pattern.

3. Summary of the Invention

The main object of the invention is a device for the generation of test vectors for integrated circuits, a device comprising communication means and at least one computer, the said communication means being used to acquire a description of a circuit, the computer being capable of taking into account possible faults in the integrated circuit, namely the jammings of its equivalent circuit diagram at one, and capable of associating a set of test vectors with these jammings at "1", with each jamming at "1" being capable of modifying at least one vector.

Another object of the invention is a method to generate test vectors for integrated circuits, a method comprising a stage in which the possible logic faults are determined and a stage in which at least one test vector per possible logic fault is generated, so that the said vector applied to the said logic circuit will give a response which will be affected by the existence of the said logic fault.

BRIEF DESCRIPTION OF THE DRAWINGS

The invention will be better understood from the following description and the appended figures, given as non-exhaustive examples, of which:

FIG. 1 is a diagram of an AND matrix of a P.L.A.;
FIG. 2 is a diagram of an OR matrix of a P.L.A.;
FIG. 3 is a diagram of an AND matrix of a P.L.A.;
FIG. 4 is a diagram of an OR matrix of a P.L.A.;
FIG. 5 is a diagram of an AND matrix of a P.L.A.;
FIG. 6 is a diagram of an OR matrix of a P.L.A.;
FIG. 7 is the actual diagram of a part of a circuit;
FIG. 8 is an equivalent diagram of the circuit of FIG. 7;
FIG. 9 is a diagram of an AND matrix of a P.L.A.;
FIG. 10 is an equivalent diagram of the circuit illustrated in FIG. 9;
FIG. 11 is a diagram of an OR matrix of a P.L.A.;
FIG. 12 is an equivalent diagram of the circuit illustrated in FIG. 11;
FIG. 13 is a diagram of an AND matrix of a P.L.A.;
FIG. 14 is an equivalent circuit diagram of the circuit shown in FIG. 13;
FIG. 15 is a diagram of an OR matrix of a P.L.A.;
FIG. 16 is an equivalent circuit diagram of the circuit shown in FIG. 15;
FIG. 17 is a diagram of a variables track of a P.L.A.;
FIG. 18 is an equivalent circuit diagram of the circuit of FIG. 17;
FIG. 19 is a diagram of an AND matrix of a P.L.A.;
FIG. 20 is an equivalent diagram of the circuit shown in FIG. 19;
FIG. 21 is a diagram of an OR matrix of a P.L.A.;
FIG. 22 is an equivalent diagram of the circuit shown in FIG. 21;
FIG. 23 is a diagram of an output track of a P.L.A.;
FIG. 24 is the equivalent circuit diagram of the circuit shown in FIG. 22;
FIG. 25 is an equivalent circuit diagram of the tracks of variables of a non-optimized P.L.A.;
FIG. 26 is an equivalent diagram of the output tracks of a non-optimized P.L.A.;
FIG. 27 is an equivalent circuit diagram of the connections between monomial tracks and tracks of variables of a P.L.A.;
FIG. 28 is an equivalent circuit diagram of connections between the output tracks and monomial tracks of a P.L.A.;
FIG. 29 is a diagram of a cell EV (S,SB E);
FIG. 30 is a diagram of a cell En (S, A 1:n),R(1:n),Z(1:n),E);
FIG. 31 is a diagram of a cell NPn (S)1:n), E(1:n);
FIG. 32 is a diagram of a cell BPn (S(1:n);, E(1:n));
FIG. 33 is a diagram of a cell OUn (S,E(1:n));
FIG. 34 is a diagram of a cell OBn (S,E(1:n));
FIG. 35 is a diagram of a cell SNn (S,A(1:n), R(1:n), Z(1:n), E);
FIG. 36 is a diagram of a cell BSn (S(1:n), E);
FIG. 37 is a diagram of a cell NBn (S(1:n), E);
FIG. 38 is a diagram of a cell ETn (S, E(1:n));
FIG. 39 is a diagram of a cell OSn (S, E(1:n));
FIG. 40 is an equivalent circuit diagram of a macrocell ENT (S(1:v), E(1:n));
FIG. 41 is an alternative embodiment of the device of FIG. 40;
FIG. 42 is an alternative embodiment of the device of FIG. 41;
FIG. 43 is an equivalent circuit diagram of a macrocell CCV (S(1:v), E(1:v));
FIG. 44 is a diagram, at the level of the primitives, of the macrocell shown in FIG. 43;
FIG. 45 is a diagram of a macrocell CMV (S(1:m), E(1:m);
FIG. 46 is a diagram of a macrocell CSN (S(1:s), E(1:s);
FIG. 47 is a diagram of a macrocell CCS (S(1:s), E(1:s));
FIG. 48 is a diagram of a macrocell CCM (S(1:m), E(1:m));
FIG. 49 is an example of an equivalent circuit diagram of a P.L.A.;
FIG. 50 is a diagram showing the grouping of patterns of a particular P.L.A.;
FIG. 51 is an equivalent circuit diagram of the P.L.A. shown in FIG. 50;
FIG. 52 is a description of the circuit of FIG. 51 in HILO simulator language;
FIG. 53 is a diagram of the device according to the invention;
FIG. 54 is a flow chart of a program used by the device of FIG. 53.

FIGS. 1 to 54 use the same references to designate the same elements.

FIGS. 1 to 52 show an example of an embodiment of a test for a P.L.A. circuit. It is understood that the invention is not limited to tests on P.L.A. circuits.

DESCRIPTION OF THE PREFERRED EMBODIMENTS

FIG. 1 shows an AND matrix of a P.L.A. The AND matrix comprises an input interface 1, hereinafter called a buffer, and a inverting input buffer 2, the said buffers being connected to each of the inputs. The buffers 1 and 2 are connected to lines of variables 4. The lines of variables 4 are connected by vertical connections (VIAs) 6 and by diodes 3 to lines of monomials 5. A circuit may be faulty because one of its patterns has been badly made, for example, because of manufacturing flaws in the input interfaces 1 or 2, or in a diode, or because a VIA has been wrongly made between the various layers of aluminum.

FIG. 2 shows an OR matrix of a P.L.A. The OR matrix has lines of monomials 5 connected to output lines 8 by means of VIAs 6 and transistors 7. The output lines 8 have, at their ends, inverting output interfaces 2.

In the OR matrix, a pattern failure may arise from a manufacturing fault in a transistor or resistor, or the incorrect making of a VIA 6.

FIG. 3 shows an AND matrix of a P.L.A. The matrix of FIG. 3 comprises several possible types of breaks in the track 11. The breaks are marked alphabetically from a to i, according to the types of effects produced. It will generally be necessary to produce different test vectors depending on the location of the break.

FIG. 4 shows an OR matrix of a P.L.A. showing the breaks 11 which affect the proper functioning of the circuit. The breaks 11 are noted a to h according to their position, which affects the functioning of the circuit differently. The breaks in tracks may occur in the various metallization layers comprising the P.L.A. In most cases, the metallization layers are made of aluminum. In one technology used by the Applicant, the first layer of aluminum has tracks with a width of 5.5 microns and the second layer of aluminum has tracks with a width of 11 microns.

FIG. 5 shows an AND matrix on which the various possible short-circuits have been shown with the reference 12. The line of dashes shows the electrical path of the short-circuit. On the variables line 4, the short-circuits have been shown with the power supply setting up a jamming at 1 or 0.

FIG. 6 shows the short-circuits capable of affecting the OR matrix of a P.L.A.

FIG. 7 shows an example of a P.L.A. input logic circuit. FIG. 8 shows its equivalent circuit diagram. The device of FIG. 7 comprises an input E connected to a first arm comprising a Schottky transistor logic operator 13 and an inverting buffer 2 and a second arm comprising only an inverting buffer 2. At the output of the first arm, a voltage V is present. At the output of the second arm, a voltage VB is present.

The equivalent circuit diagram has an inverting buffer 2 connected to two arms. The first arm comprises a buffer 1 and an inverting buffer 2 which are series-connected. The second arm comprises two series-connected inverting buffers 2.

A failure which consists in a jamming of E at 0 is equivalent, in FIG. 8, to a jamming of the node 22 at 1.

A failure which consists in a jamming of E at 1 is equivalent, in FIG. 8, to a jamming of the node 21 at 1.

A failure which consists in a jamming of V at 0 is equivalent to a jamming of the node 26 at 1.

A failure which consists in a jamming of V at 1 is equivalent to a jamming of the node 25 at 1.

A failure which consists in a jamming of VB at 0 is equivalent, in FIG. 8, to a jamming of the node 23 at 1.

A failure which consists in a jamming of VB at 1 is equivalent, in FIG. 8, to a jamming at 1 of the node 24.

FIG. 9 shows an AND matrix. In the AND matrix, the absence of a VIA implies the elimination of the corresponding variable in the n monomials concerned. n is the number of diodes in the pattern containing the faulty VIA. n ranges, for example, from 1 to 4.

FIG. 10 shows an equivalent circuit diagram of the device of FIG. 9. The line of variables 4 is connected by a buffer 1 to n lines of monomials 5. The lines of monomials comprise, for example, two gates 13. In the equivalent circuit diagram of FIG. 10, the failures of the VIAs imply a jamming at 1 of the output 21 of the buffer used n times.

FIG. 11 shows an OR matrix. In the OR matrix, the absence of an VIA implies the elimination of the corresponding monomial in the n' outputs concerned. n' is the number of transistors in the pattern containing the faulty VIA. n' is, for example, equal to 1 or 2.

FIG. 12 shows the equivalent circuit diagram of the device of FIG. 11. In FIG. 12, the failures imply a jamming at 1 of the output 21 of a buffer 2 used n' times.

Thus, in the FIGS. 9 to 12, an absence of a VIA 6 implies a jamming of the node 21 at 1.

FIG. 13 shows an AND matrix of a P.L.A. A fault 110 consisting of an absence of diodes is reflected in the equivalent circuit diagram of FIG. 14 by the elimination of the corresponding variable in the expression of a monomial. Thus, in the equivalent circuit diagram of FIG. 14, the fault 110 of the FIG. 13 is reflected by a jamming, at 1, of the buffer 1 output at the point 21.

FIG. 15 shows an OR matrix with one of its transistors 7 having a fault 110. The absence of a transistor 7 is reflected in the elimination of the corresponding monomial in the logic expression of an output. It is reflected in the equivalent circuit diagram of FIG. 16 by a jamming at 1 of the output 21 of a buffer.

From the logic point of view, the absence of a supply resistance is equivalent to a break in the monomial line corresponding to the input of the OR matrix.

FIG. 17 shows the diagram of a track of variables 4 while FIG. 18 shows an equivalent circuit diagram of the device of FIG. 17. When there is a break in a track of variables, the result is the disappearance of the variable from the expression of all the monomials that are physically located downstream of the break. In the equivalent circuit diagram of FIG. 18, this consequence is reflected by a jamming of a buffer at 1.

A break in the track of variables 4 at "a" is equivalent to a jamming of the node 21 of FIG. 18 at 1.

A break in the track of variables 4 at p is equivalent to a jamming of the node 22 of FIG. 18 at 1.

A break in the track of variables 4 at c is equivalent to a jamming of the node 23 of FIG. 18 at 1.

FIG. 19 shows the diagram of an AND matrix. FIG. 20 shows the equivalent diagram of the device of FIG. 19. When there is a break in a monomial track in the AND matrix, the result is the disappearance, from the expression of the monomial, of the variables physically connected upstream of the break. This result is reflected in the equivalent circuit diagram of FIG. 30 by a jamming of the outputs of the logic AND elements 13 at 1. The output of the last AND logic gate 13 represents the line of monomials.

A break in the monomials track 5 at "a" is equivalent to a jamming of the node 21 of FIG. 20 at 1.

A break in the monomials track 5 at b is equivalent to a jamming of the node 22 at 1.

A break in the monomials track 5 at c is equivalent to a jamming of the node 23 of FIG. 20 at 1.

A break in the monomials track 5 at d is equivalent to a jamming of the node 24 of FIG. 20 at 1.

FIG. 21 shows an OR matrix. FIG. 22 shows the equivalent circuit diagram of the device of FIG. 1. FIG. 21 shows a line of monomials 5, comprising two series-connected buffers 1. The first buffer 1 is preceded by the node 21 and followed by the node 22. The second buffer 1 is followed by the node 23. There is an inverting buffer 2 on the monomials line 5 upstream of the node 21. A buffer 1 is connected to the node 21, the said buffer 1 being connected to two output lines 8. Similarly, a buffer 1 is connected to the node 23, and this buffer 1 is connected to two output lines 8.

When there is a break 11 in a monomials track 5 in an OR matrix, the consequence is the disappearance of the monomial from the logic expression of the outputs physically connected downstream of the break 11. This consequence is reflected in the jamming at 1 of a buffer in the equivalent circuit diagram.

The break 11 in the monomials track 5 at "a" is equivalent to the jamming at 1 of the node 21 of FIG. 2.

The break 11 in the monomials track 5 at b is equivalent to the jamming at 1 of the node 22 of FIG. 22.

The break 11 of the monomials track 5 at c is equivalent to the jamming at 1 of the node 23 of FIG. 22.

FIG. 23 shows an output track 8 of a P.L.A. FIG. 24 shows cascade-connected AND operators 13.

The output of each AND operator 13 is connected to one of the two inputs of the following AND operator 13. The first input of the first AND operator 13 and the second inputs of the following AND operators 13 are connected by a buffer 1 to the lines of monomials 5. The output of the last AND operator 13 is connected by an inverting buffer 2 to the output line 8.

When an output line 8 is subjected to a break 11, the result is the disappearance, from the output logic expression, of the monomials located upstream of the break. This result is reflected in the equivalent circuit diagram by a jamming at 1 of the output of an AND operator 13.

The break 11 in the output track 8 at "a" is equivalent to the jamming at 1 of the node 21 of FIG. 24.

The break 11 in the output track 8 at b is equivalent to the jamming at 1 of the node 22 of FIG. 24.

The break 11 in the output track 8 at c is equivalent to the jamming at 1 of the node 23 of FIG. 24

A break in the output track 8 at d is equivalent to a jamming at 1 of the node 24 of FIG. 24.

A break in a VIA 6 is equivalent to a jamming at 1 of a buffer 1 in the equivalent circuit diagram FIG. 25 shows a part of the equivalent circuit diagram of a P.L.A. incorporating devices to detect short-circuits between tracks. FIG. 25 shows four inputs of lines of variables 4 connected to inverting buffers 2. Each output of the inverting buffer 2 is connected firstly, to a first input of an AND logic gate 13 and secondly, to a first input of a NOR logic gate 15. Buffers 1 are connected to the second inputs of the AND logic gates 13. The output of each AND logic gate 13 is connected to an input of the NOR logic gate 15 of the neighboring line of variables.

The injection of a 0 by the buffer 1 makes it possible to represent a short-circuit between adjacent tracks of variables by a jamming at 1. For the consequence of this failure is to convert the logic value of two variables concerned into their product. The failure is reflected by the jamming at 1 of the output of a buffer in the equivalent circuit diagram. In the case of an optimized P.L.A. a track of variables may be adjacent to more than two tracks of variables. The equivalent diagram to be used then consists of a generalization of the diagram illustrated in FIG. 25.

Furthermore, the diagram of FIG. 25 can be used for the short-circuits between adjacent monomial tracks. For the consequence of this failure is that the logic expression of two short-circuited monomials is converted into their logic product.

The short-circuit between the first and second lines of variables is equivalent to a jamming at 1 of the node 21 located at the output of the buffer 1 located between these two lines in FIG. 25.

The short-circuit between the second and third lines of variables 4 is equivalent to a jamming at 1 of the node 22 of FIG. 25, which is between the said lines of variables.

The short-circuit between third and the fourth lines of variables 4 is equivalent to the jamming at 1 of the node 23 located, in FIG. 25, between the third and fourth lines of variables 4.

FIG. 26 shows the equivalent circuit diagram which represents the short-circuits between adjacent output tracks. FIG. 26 shows the equivalent diagram used to detect short-circuits between adjacent output tracks 8.

Each output track 8 is connected firstly to an input of an OR logic gate 16 and, secondly, to a first input of an AND logic gate 13. A buffer 1 is connected to the second inputs of the AND logic gates 13. The output of each AND logic gate 13 is connected to an input of the said OR logic gates 16 belonging to adjacent output lines 8.

By applying a logic zero to the input buffers 1, the short-circuits between two output tracks 8 can be represented by jammings at 1. For a short-circuit between two adjacent output tracks 8 results in a conversion of the expression of the two outputs 8 into their logic OR. It is therefore represented in the diagram of FIG. 6 by a jamming at 1 of the output of a buffer.

The short-circuit between the first and second output lines 8 is equivalent to the jamming at 1 of the node 21 located between these two lines A short-circuit between the second and third output lines 8 in the diagram 26 is equivalent to the jamming at 1 of the node 22 located between these two lines.

FIG. 27 shows an equivalent circuit diagram used to detect short-circuits between monomial tracks 5 and tracks of variables 4. In one alternative embodiment (not shown), it enough to loop each monomial back on each variable, since the loop closes with the jamming of a node at 1. However, the presence of the said loops may make this embodiment unsuited to the use of a conventional automatic generator of test sequences. Thus it is to our advantage to use the equivalent circuit diagram of FIG. 27.

The device of FIG. 27 has monomial lines 5 connected firstly to inputs of AND logic gates 13 and, secondly, to the inputs of the inverting buffers 2. The outputs of the inverting buffers 2 are series-connected to inputs of AND logic gates 13. The second inputs of the AND logic gates 13 are connected to buffers 1. The outputs of the sets of AND logic gates 13, connected to the various inverted buffers 2, are connected to NOR logic gates 15.

Each output of the NOR logic gate 15 is connected to the inputs of the AND logic gate 13, connected to the monomials line 5, if the variable appears in the expression of these monomials. In the example shown in FIG. 27, the second line of monomials (starting from the top) is equal to the product of the second and last lines of variables.

A short-circuit between a monomial track and a track of variables causes the logic value of the variable to be replaced by the expression of the monomial.

The short-circuit between the line 5 of monomials M(1) and the line of variables I(1) is equivalent in FIG. 27 to the jamming of the node 22 at 1.

The short-circuit between the line 5 of monomials M(1) and the line of variables I(2) is equivalent in FIG. 27 to the jamming of the node 22 at 1.

The short-circuit between the line 5 of monomials M(1) and and the nth line of variables is equivalent in FIG. 27 to the jamming of the node 23 at 1. n is the number of variables of the P.L.A.

The short-circuit between the line 5 of monomials M(2) and the line of variables I(2) is equivalent in FIG. 27 to the jamming of the node 24 at 1.

FIG. 28 shows the equivalent circuit diagram of a circuit which can be used to detect a short-circuit between an output track and a monomial track. This failure causes the value of the monomial to be replaced by that of the output. Just as for short-circuits between the monomial track 5 and the track of variables 4, an equivalent circuit diagram has been used with no loop-back, in order to facilitate the task of the automatic generators of test vectors.

FIG. 28 shows four output lines 8, F(1) to F(4). Each output line 8 is firstly connected to a first input of an OR logic gate 16 and secondly, series-connected to a set of AND logic gates 13. The second input of the AND logic gates 13 is connected to buffers 1. The outputs of the AND logic gates 13, connected to the four output lines 8, S(1) to S(4), are connected to m OR logic gates 16, marked I(1) to I(m). Each logic gate 16 I(i) is connected to the input of OR logic gates 16 having one input connected to an output line 8 for which the $i^{th}$ monomial M(i) appears in the expression of the corresponding output line.

The short-circuit between the output S(1) line 8 and the second monomial is equivalent, in FIG. 28, to the jamming of the node 22 at 1.

The short-circuit between the output S(1) line 8 and the $m^{th}$ monomial is equivalent in FIG. 28 to the jamming of the node 23 at 1. m is the number of monomials of the P.L.A.

The short-circuit between the output S(2) line 8 and the first monomial is equivalent in FIG. 28 to the jamming of the node 25 at 1, and so on.

The lines I(1) to I(M) are all identical. However, a test vector which can be used to detect a jamming at 1 at the output of a buffer 1, for example at the node 25, will make it possible to detect a short-circuit between an output 2 track and the second monomial.

A short-circuit between a monomial track and a VIA track, is equivalent from the logic point of view to the short-circuit between the monomial track and the track of variables 4 corresponding to the vertical connection. We are therefore again in the case of FIG. 27.

A short-circuit between an output track 8 and a VIA 6 track is equivalent to a short-circuit between the output track 8 and the monomial track corresponding to the VIA 6 track.

A short-circuit between a track of variables 4 and the electrical power supply corresponds, at the logic level, to the locking at 0 or 1 of the value of the track of variables. It is therefore equivalent to a jamming at 0 or 1 of an input buffer This case is illustrated in the FIGS. 7 and 8. A short-circuit between a monomial track 4 and the power supply causes the value of the monomial to be blocked at 0 or 1.

A short-circuit which causes a locking at 1 is equivalent to a break in the track 5 at d in FIG. 19.

A short-circuit with the ground is equivalent to a break in the monomial track 5 at "a" in FIG. 21.

Advantageously, for the generation of the test vectors themselves, a test generator of a known type is used, for example, the HILO test vectors generator. The description of the equivalent circuit diagram for the test vectors generator can be obtained:

By the graphic acquisition of the equivalent circuit diagram and then by the use of an interface with the test vectors generator;

By using an interface with the description in a high-level language, for example, PAOLA;

Direct description with the editor.

Advantageously, to simplify the graphic acquisition or direct description of the equivalent circuit diagram in a language understandable by the test vector generator, for example, HILO, a regular, hierarchically-organized structure employing cells and macrocells is used.

For example, the cells are general ones and are described once and for all in a HILO language library. Since these cells are simple ones, direct description in the HILO format raises no difficulties.

Non-exhaustive examples of cells are shown in FIGS. 29 to 39.

The macrocells consist of cells. These macrocells depend on the circuit, for example a P.L.A., of which a model is to be made. The use of macrocells simplifies the equivalent circuit diagram. Examples of macrocells are shown in FIGS. 40 to 47.

FIG. 29 shows a cell 17 called EV (S,SB,E). The cell 17 comprises an input 18 and two outputs 19 and 20. The input 18 is connected to a first inverting buffer 2. The output of the first inverting buffer 2 is connected firstly to a buffer 1 and a buffer 2, which are series-connected to the output 19, and secondly to two inverting buffers which are series-connected to the output 20.

FIG. 30 shows a cell 30 called ENn(S,A (1:n), R (1:n), Z(1:n), E) comprising an input 18, inputs 41, inputs 43, outputs 42 and an output 19. The inputs 41 are connected to the first inputs of the AND logic gates 13. The input 18 is connected to an inverting buffer 2. The output of the inverting buffer 2 is connected firstly, in parallel, to second inputs of AND logic gates 13 and, secondly, to a NOR logic gate 15. Furthermore, the inputs 43 are connected to the inputs of the NOR gate 15. The output of the NOR gate 15 is connected to the output 19 of the cell 30.

FIG. 31 shows a cell 31 called NPn (S(1:n), E(1:n)) comprising several parallel-set inverting buffers 2. Each inverting buffer 2 is connected to an input 18 and an output 19.

FIG. 32 shows a cell 32 called BPn (S(1:n), E(1:n)) comprising several parallel-set buffers 1. Each buffer 1 is connected to an input 18 and an output 19.

FIG. 33 shows a cell 33 called OUn (S,E(1:n)) comprising several inputs 18 and an output 19. Each buffer 1 is connected to an input 18 and an output 19. A 0 can be injected into each of the AND logic gates 13 by means of the buffer 1 connected to a second input of the said AND logic gates 13. The outputs of the AND logic gates 13 are connected to the inputs of a NOR logic gate 15, the output of the NOR logic gate 15 is connected to the output 19 of the cell 33.

FIG. 34 shows a cell 34 called OBn(S, E(1:n)) comprising several inputs 18 and one input 19. The inputs 18 are connected to a first input of AND logic gates 13. The second inputs of logic gates 13 are connected to buffers 1. The buffers 1 are used to inject zeros at an input of the AND logic gate 13. The outputs of the AND logic gates 13 are connected to an OR logic gate 16. The output of the OR logic gate 16 is connected to the output 19 of the cell 34.

FIG. 35 shows a cell 35 called SNn(S,A(1:n), R(1:n), Z(1:n),E) comprising one input 18, inputs 43 and 44, one output 19 and outputs 42. The input 18 is parallel-connected to the first inputs of the AND logic gates 13 and to a first input of an OR logic gate 16. Furthermore, each input 44 is connected to a second input of the said AND logic gates 13. Each output of the AND logic gates 13 is connected to an output 42 of the cell 35. The inputs 43 are connected to the inputs of an OR logic gate 16. The output of the OR logic gate 16 is connected to the output 19 of the cell 35.

FIG. 36 shows a cell 36 called BSn(S(1:n), E)) comprising an input 18 and outputs 19. The input 18 is connected to series-connected buffers 1. An output 19 of the cell 36 is connected through a second buffer 1 to the output of each series-connected buffer 1. The last of the series-connected buffers 1 is connected to two outputs 19 through two buffers 1.

FIG. 37 shows a cell 37 called NBn(S(1:n),E) comprising an inverting buffer 2 connected to a series of buffers 1. The output of the inverting buffer 2 is connected to an output 19 through a buffer 1. Between two series-connected buffers 1, there is a connection which is connected, through a buffer 1, to an output 19 of the cell 37. The last series-connected buffer is connected to two outputs 19 through two buffers 1.

FIG. 38 shows a cell 38 called ETn(S,E(1:n)) comprising inputs 18 and an output 19. The first input 18 is connected through a buffer 1 to a first input of an AND logic gate 13.

The second input 18 is connected through a buffer 1 to a second input of the first AND logic gate 13.

The output of the first AND logic gate 13 is connected to a first input of a second AND logic gate 13.

The third input 18 is connected through a buffer 1 to a second input of the AND logic gate 13.

The output of the second AND logic gate 13 is connected to a first input of the third AND logic gate 13.

The fourth input 18 is connected through a buffer 1 to a second input of the third AND logic gate 13.

The output of the $i^{th}$ AND logic gate 13 is connected to one of the inputs of the $(i+1)^{th}$ AND logic gate 13.

The $i^{th}$ input 18 is connected through a buffer 1 to the second input of the $(i-1)^{th}$ AND logic gate 13.

The last input 18 is connected through a buffer 1 to the second input of the last AND logic gate 13. The output of the last AND logic gate 13 is connected to the output 19 of the cell 38.

FIG. 39 shows a cell 39 called OSn(S,E(1:n)) comprising inputs 18 and an output 19. The first input 18 is connected through a buffer 1 to a first input of an AND logic gate 13.

The second input 18 is connected through a buffer 1 to a second input of the first AND logic gate 13.

The output of the first AND logic gate 13 is connected to a first input of a second AND logic gate 13.

The third input 18 is connected through a buffer 1 to a second input of the AND logic gate 13.

The output of the second AND logic gate 13 is connected to a first input of the third AND logic gate 13.

The fourth input 18 is connected through a buffer 1 to a second input of the third AND logic gate 13.

The output of the $i^{th}$ AND logic gate 13 is connected to one of the inputs of the $(i+1)^{th}$ AND logic gate 13.

Yhr $i^{th}$ input 18 is connected through a buffer 1 to the second input of the $(i-1)^{th}$ AND logic gate 13.

The output of the last logic gate 13 is connected to the input of an inverting buffer 2. The output of the inverting buffer 2 is connected to the output 19 of the cell 39.

The following figures show non-exhaustive examples of macrocells which can be used to describe the logic equivalent diagram of a circuit.

FIG. 40 shows a cell 50 called a macrocell ENT(S(1:v),E(1:n)). The cell 50 comprises several parallel-connected cells 17 of the FIG. 29.

The macrocell 50 of FIG. 40 corresponds to the example of a P.L.A. in which all the direct inputs and all the inverted inputs are used as invariables.

Advantageously, the macrocell 50 has as many cells 17 as the P.L.A. has inputs.

FIG. 41 shows an alternative embodiment of the macrocell 50 of FIG. 40. The macrocell 51 of FIG. 41 corresponds to the case where an inverted input is used as a variable. Whenever an inverted input is not a variable of the P.L.A., the cell 17 of the macrocell 51 is replaced by two series-connected inverting buffers 2. FIG. 41 shows an example in which the second inverted input is not used as a variable of the P.L.A.

FIG. 42 shows an alternative embodiment of the device of FIG. 40. When a direct input is not used as a variable of the P.L.A., the cell 17 corresponding to the macrocell 52 is replaced by an inverting buffer 2. In the example shown in FIG. 42, the second direct input is not used by any monomial of the P.L.A.

FIG. 43 shows a macrocell 53 called a macrocell CCV (S(1:v)E(1:v)). The macrocell 53 comprises a cell 32 of the FIG. 32 and several cells 30 of the FIG. 30. Advantageously, each cell 30 corresponds to a variable of the P.L.A. considered.

The interconnections of the cells 30 and 32 of the macrocell 53 are not shown because they depend on the P.L.A. for which a model is sought to be made.

For example, the outputs 42 of the cells 30 are linked to the inputs 43 of the cells 30 corresponding to the adjacent variables. For example, if the variables 1 and 2 are adjacent, one of the outputs 42 of the first cell 30 must be connected to one of the inputs 43 of the second cell 30 and vice versa. Each output 19 of the cell 32 is connected to two inputs 41 (not yet connected) of two cells 30 of adjacent variables. For example, if the variables 1 and 2 are adjacent, one of the outputs 19 of the first cell 30 is connected to one of the inputs 41 of the first cell 30 and to one of the inputs 41 of the second cell 30.

FIG. 44 shows the logic diagram corresponding to the cell 53 of the FIG. 43 in the frequent case where each track of variables has two neighboring tracks, one to the right and the other to the left.

Each track of variables 4 is connected firstly to an input of an OR logic gate 16 and secondly, to a first input of an AND logic gate 13. The second inputs of the AND logic gates 13 are connected, two by two, to a buffer 1. The output of each AND logic gate 13 is connected to an input of the said OR logic gates 16 belonging to the adjacent lines of variable. By applying a logic zero to the input buffer 1, it is possible to represent a short-circuit between two tracks of variables 4 by a jamming at 1. For the short-circuits between two adjacent tracks of variables 4 cause the expression of the two variables 4 to be converted into their logic AND. This fault is represented in the diagram of FIG. 4 by a jamming of the output of a buffer at 1.

The short-circuit between the first and second lines of variables 4 is equivalent to the jamming at 1 of the node 21 located between these two lines.

A short-circuit between the first and second lines of variables 4 in the diagram 44 is equivalent to the jamming at 1 of the node 21 located between these two lines.

FIG. 45 shows a macrocell 55 called CMV(S(1:m), E(1:m)). The macrocell 55 comprises a cell 31 of FIG. 31, cells 33 of FIG. 33 and AND logic gates 13. The macrocell 55 comprises m inputs 18 corresponding, for example, to monomials of the P.L.A. The inputs 18 are connected firstly to first inputs of m AND logic gates 13 and secondly, to a cell 31. The cell 31 is parallel-connected to v cells 33, v being, for example, the number of variables of the P.L.A. considered.

Each cell 33 corresponds to a variable and is connected to AND logic gates 13 which are themselves connected to monomials, in the expression of which the corresponding variable appears.

FIG. 46 shows a macrocell 56 called CSM(S(1:s), E(1:s)). The macrocell 56 has s inputs 18, s being, for example, the number of outputs comprised by the P.L.A. considered. Each input 18 is connected to a set of m cells 34 of FIG. 34, m being, for example, the number of monomials of the P.L.A. considered. At 900, we have shown the concatanation of the wires which are connected to the inputs 18 and form a bus connected to the cells 34.

Each cell 34 corresponds to a monomial and is connected to the NOR logic gates 15 which are themselves connected to an input 18 corresponding to an output of the P.L.A., in the expression of which the corresponding monomial appears.

FIG. 47 shows a macrocell 57 called CCS(S(1:s), E(1:s)). The cell 47 comprises a cell 31 of FIG. 31 as well as cells 35 of FIG. 35. The interconnection between the cells is not shown in the FIG. 47 inasmuch as it depends on the P.L.A. considered. For the adjacent output tracks, the outputs 42 should be connected to the inputs 43 of the corresponding cells, and one of the outputs 19 of the cell 31 should be connected to the inputs 41 of the two cells 35 considered. It must be noted that, in the case of non-optimized P.L.A.s and in certain technologies, the output tracks 8 are at a minimum distance of two pitches from one another. In this case there is no adjacent output track and the macrocell 57 is not used.

FIG. 48 shows a macrocell 53 called CCM(S(1:m), E(1:m)). The macrocell 53 has a cell 32 of FIG. 32 and several cells 30 of FIG. 30. Advantageously, each cell 30 corresponds to a monomial of the P.L.A. considered.

The interconnections of the cells 30 and 32 of the macrocell 53 are not shown because they depend on the P.L.A. for which a model is sought to be made.

For example, the outputs 42 of the cells 30 are connected to the inputs 43 of the cells 30 corresponding to adjacent monomials. For example, if the monomials 1 and 2 are adjacent, one of the outputs 42 of the first cell 30 should be connected to one of the inputs 43 of the second cell 30 and vice versa. Each output 19 of the cell 32 is connected to two inputs 41 (not yet connected) of two cells 30 of adjacent monomials. For example, if the monomials 1 and 2 are adjacent, an interconnection connects one of the outputs 19 of the cell 30 to one of the inputs 41 of the first cell 30 and to one of the inputs 41 of the second cell 30.

FIG. 49 shows an example of an equivalent circuit diagram comprising macrocells of a P.L.A. with three inputs, six variables, eight monomials and five outputs. The P.L.A. 100 has an input E on three bits. The input E is connected to a macrocell 50. The macrocell 50 is connected by six wires to a macrocell 53. The macrocell 53 is parallel-connected to six macrocells 36. The cells 36 are connected to eight cells 38. The wiring, which depends on the particular P.L.A. considered, is not shown in FIG. 49. The cells 38 are connected to a cell 53. The cell 53 is connected by eight wires to a cell 55. The cell 55 is parallel-connected to eight cells 37. The cells 37 are parallel-connected to five cells 39. The interconnection between the cells 37 and 39 depend on the particular P.L.A. considered and is not shown in FIG. 49. The cells 39 are connected to a cell 57. The cell 57 is connected by five wires to a cell 56 .The cell 56 is connected by five wires to the output of the P.L.A.

The following paragraph gives an example of a description in the language, PAOLA, of a P.L.A. with seven inputs, fourteen variables, eighteen monomials and thirteen outputs. This description contains all the information necessary for an automatic generator of test vectors to prepare the test sequences needed for the logic testing of the P.L.A.

| | |
|---|---|
| XX10XXX | 1001001000000 |
| XX1110X | 0011001000000 |
| 0X1111X | 0010101000000 |
| 1X1111X | 0011001000000 |
| XX11010 | 0011000110001 |
| XX11011 | 0011001010000 |
| XX11001 | 0010011000101 |
| XX11000 | 0010100100100 |
| XX01XXX | 1001001000000 |
| X000100 | 1001001000010 |
| X100100 | 1001000100000 |
| X0001X1 | 1001001000000 |
| X1001X1 | 1001000100000 |
| X000110 | 1001001000000 |
| X100110 | 0100101000000 |
| X0000XX | 1001001000000 |
| X1000XX | 0100100100000 |
| XX00XXX | 0000000001000 |

FIG. 50 shows the physical structure of the P.L.A. described in the preceding paragraph. The dots represent the connections, and sets of dots belonging to one and the same pattern have been encircled. It is assumed that the adjacent tracks in this diagram are physically adjacent.

FIG. 51 describes the specific interconnections used to test the P.L.A. described in the preceding paragraph. The input wires are connected to a macrocell 50. The macrocell 50 is connected by fourteen wires to a macrocell 53. The macrocell 53 is connected to fourteen cells 36. The cells 36 are connected to eighteen cells 38. The cells 38 are connected to a macrocell 53. The macrocell 53 is connected to a macrocell 55. The macrocell 55 is connected to eighteen cells 37. The cells 37 are connected to thirteen macrocells 39. For the clarity of the figure, the connections between the cells 37 and 39 have not been shown in it. The cells 39 are connected to a macrocell 57. The macrocell 57 is connected to a macrocell 56 by thirteen wires. The macrocell 56 is connected by thirteen wires to thirteen outputs of the P.L.A. It is observed that, for the preceding P.L.A.s, it was possible to test 1,650 possible faults with twenty-two test vectors. One and the same test vector is affected differently by different faults of the integrated circuit to be tested. The cover rate obtained is equal to the cover rate of an exhaustive test.

FIG. 52 gives a description of the P.L.A. described earlier in HILO automatic test sequence generator language.

FIG. 53 shows a device according to the invention, for testing and generating test vectors The characteristics of an integrated circuit 70 are introduced into the memory 71 of a computer 72. For example, communications means 79 are used to transmit data pertaining to the integrated circuit 70 to the computer 72, using a computer-assisted design (CAD) device or using an acquisition device (not shown). Using a program stored in a peripheral 73, the computer 72 determines the possible faults of the integrated circuit to be examined.

In a first embodiment of the device according to the invention, the computers 72 generate at least one test vector which, when applied to the circuit 70, will be modified by the presence of a fault in the said circuit. It is understood that one and the same vector can be modified by several faults.

In a second alternative embodiment of the device according to the invention, the computer 72 prepares an equivalent diagram of the circuit 70, capable of being processed by a conventional type of test vectors generator 74. In this case, the computer 72 sends the test vectors generator 74 the description of the equivalent diagram of the circuit 70.

The test vector generators 70 generate the test vectors needed to test the equivalent circuit diagram. It is understood that this set of test vectors of the equivalent circuit diagram can be used to test and detect the faults of the circuit 70. The sequence of test vectors generated by the generators 74 is transmitted to a test device 75 of a conventional type. The test device 75 can be used to test the circuits 70.

It is, of course, possible to use a general-purpose computer to generate the test vectors.

FIG. 54 is a flow chart of a program capable of being applied by a computer 72 of FIG. 53.

At 60 the computer acquires the data pertaining to the integrated circuits to be tested.

The next step is at 61.

At 61, the computer locates the possible faults in the circuit to be tested.

The next step is at 62.

At 62, the computer 72 determines an equivalent circuit of the circuit to be tested.

The next step is at 63.

At 63, either the computer 72 or, advantageously, a test vector generator 74 generates the test vectors of the circuit equivalent to the integrated circuit 70.

The device according to the present invention can be applied to the testing of integrated circuits, chiefly integrated circuits of the combinational type. Furthermore, the present invention can be applied especially to tests on P.L.A.s inasmuch as it is the only method for testing large-sized P.L.A.s.

What is claimed is:

1. A method of testing each of a series of integrated logic circuits comprising (FIG. 54)
the steps of
analyzing (60) each type of integrated circuit and determining (61) possible logic faults therein including logic faults caused by the physical structure and relative position of the circuit elements in the integrated logic circuit and how each such logic fault would affect outputs expected to be triggered from said integrated logic circuit by a particular pattern of inputs;
generating (63) and applying to inputs of each circuit at least one test vector per possible logic fault so that said vector applied to said logic circuit will trigger at least one actual output pattern which will reveal the existence of any such logic fault;
comparing the actual pattern of outputs from said integrated logic circuit with said expected outputs, and
indicating, for each integrated logic circuit tested, whether said actual and expected output patterns match;
wherein the fault-determining step comprises
the step of determining (62) cells logically equivalent to actual parts of the integrated circuit.

2. A method according to claim 1 wherein a test vector is matched with each possible logic fault.

3. A method according to the claim 1 wherein the integrated circuit tested is a combinational circuit.

4. A method according to the claim 1 wherein the integrated circuit tested is a programmable logic array.

5. A method according to claim 1, comprising
a step of determining an entire equivalent circuit diagram of the integrated circuit, said equivalent circuit diagram comprising a set of interconnected cells.

6. A method according to claim 1 wherein
the logically equivalent cells are hierarchically organized, and each cell consists of a set of interconnected cells of lesser complexity.

7. A method according to claim 5 wherein
the step of generating and applying a test vector to an integrated circuit, triggers a response which is affected by the presence of any logic fault in said circuit, and each test vector is set up by a conventional test vector generator (74), using the equivalent diagram of said circuit determined in said diagram-determining step.

* * * * *